United States Patent
Duewer et al.

(10) Patent No.: US 7,352,303 B1
(45) Date of Patent: *Apr. 1, 2008

(54) SYSTEMS AND METHODS FOR CLOCK MODE DETERMINATION UTILIZING PRIORITIZATION CRITERIA

(75) Inventors: Bruce Eliot Duewer, Austin, TX (US); John Laurence Melanson, Austin, TX (US); Kartik Nanda, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 382 days.

This patent is subject to a terminal disclaimer.

(21) Appl. No.: 11/135,995

(22) Filed: May 24, 2005

Related U.S. Application Data

(60) Provisional application No. 60/574,330, filed on May 25, 2004.

(51) Int. Cl.
*H03M 7/00* (2006.01)
(52) U.S. Cl. ........................................ 341/61; 341/123
(58) Field of Classification Search ................ 341/123, 341/122, 61, 141; 331/16–18, 23; 375/375, 375/376
See application file for complete search history.

(56) References Cited

U.S. PATENT DOCUMENTS

| | | | | |
|---|---|---|---|---|
| 5,432,826 A | * | 7/1995 | Rieder | 375/371 |
| 5,598,475 A | * | 1/1997 | Soenen et al. | 713/168 |
| 6,006,165 A | * | 12/1999 | Okada | 702/96 |
| 6,037,814 A | * | 3/2000 | Hirakawa | 327/156 |
| 6,043,803 A | * | 3/2000 | Shimizu | 345/581 |
| 6,198,353 B1 | * | 3/2001 | Janesch et al. | 331/16 |
| 6,281,821 B1 | * | 8/2001 | Rhode et al. | 341/144 |
| 6,492,928 B1 | * | 12/2002 | Rhode et al. | 341/144 |
| 6,522,122 B2 | * | 2/2003 | Watanabe et al. | 324/76.77 |
| 6,556,157 B1 | * | 4/2003 | Itani et al. | 341/123 |
| 6,580,770 B2 | * | 6/2003 | Imanaka et al. | 375/341 |
| 6,667,704 B1 | * | 12/2003 | Grale et al. | 341/123 |
| 7,049,988 B1 | * | 5/2006 | Duewer et al. | 341/123 |

\* cited by examiner

*Primary Examiner*—Linh Nguyen
(74) *Attorney, Agent, or Firm*—James J. Murphy; Thompson & Knight LLP

(57) ABSTRACT

A system for determining a data converter operating mode includes measurement circuitry that measures a master clock frequency of a master clock signal received without a modification in frequency from a master clock signal source and that measures a frequency ratio between a frequency of a data clock signal and the master clock frequency. A mapping system maps the measurements of the master clock frequency and the frequency ratio to an operating mode of the data converter. In other embodiments, mapping systems map the measurements of the master clock frequency and the frequency ratio to an operating mode of the data converter based on mode priority constraints. In additional embodiments, mapping systems map the measurements of the master clock frequency and the frequency ratio to an operating mode of the data converter by narrowing the choices of master clock divide ratios and subsequently determining an operating mode from the frequency ratio.

35 Claims, 26 Drawing Sheets

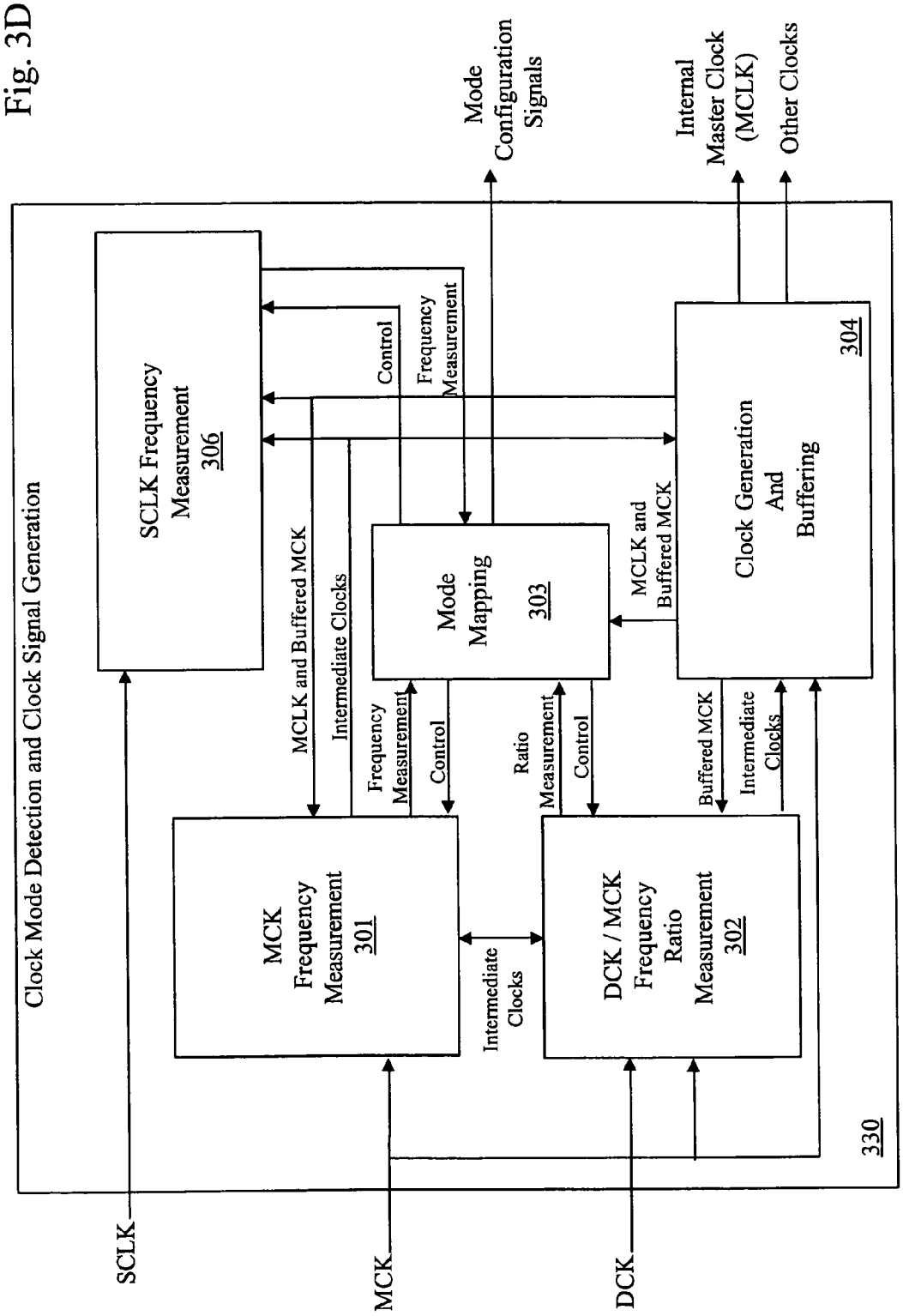

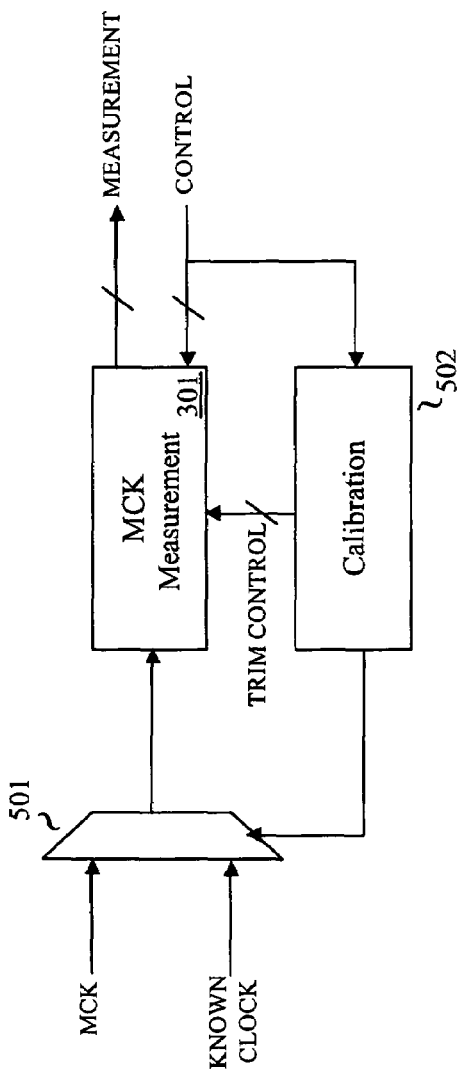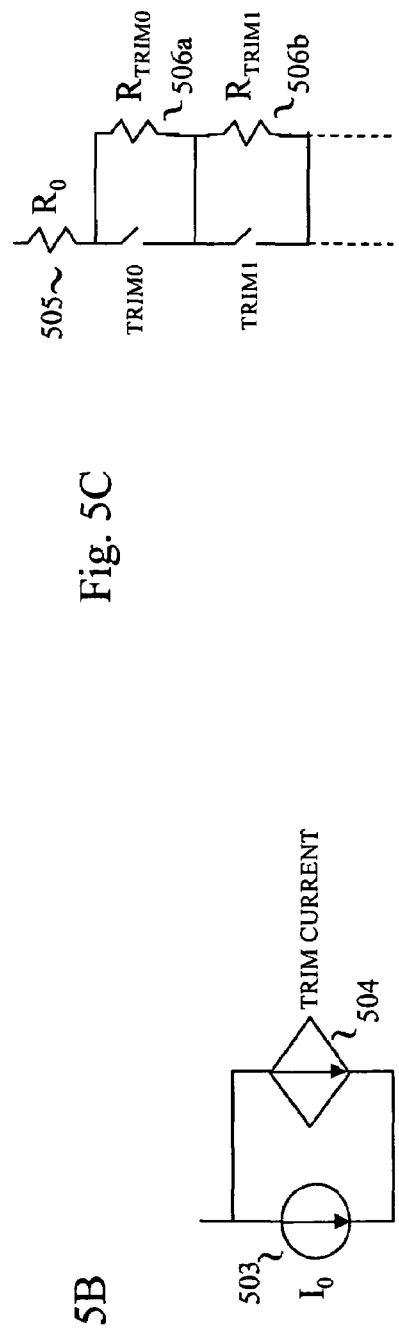
Fig. 5A
Fig. 5B
Fig. 5C
Fig. 5D

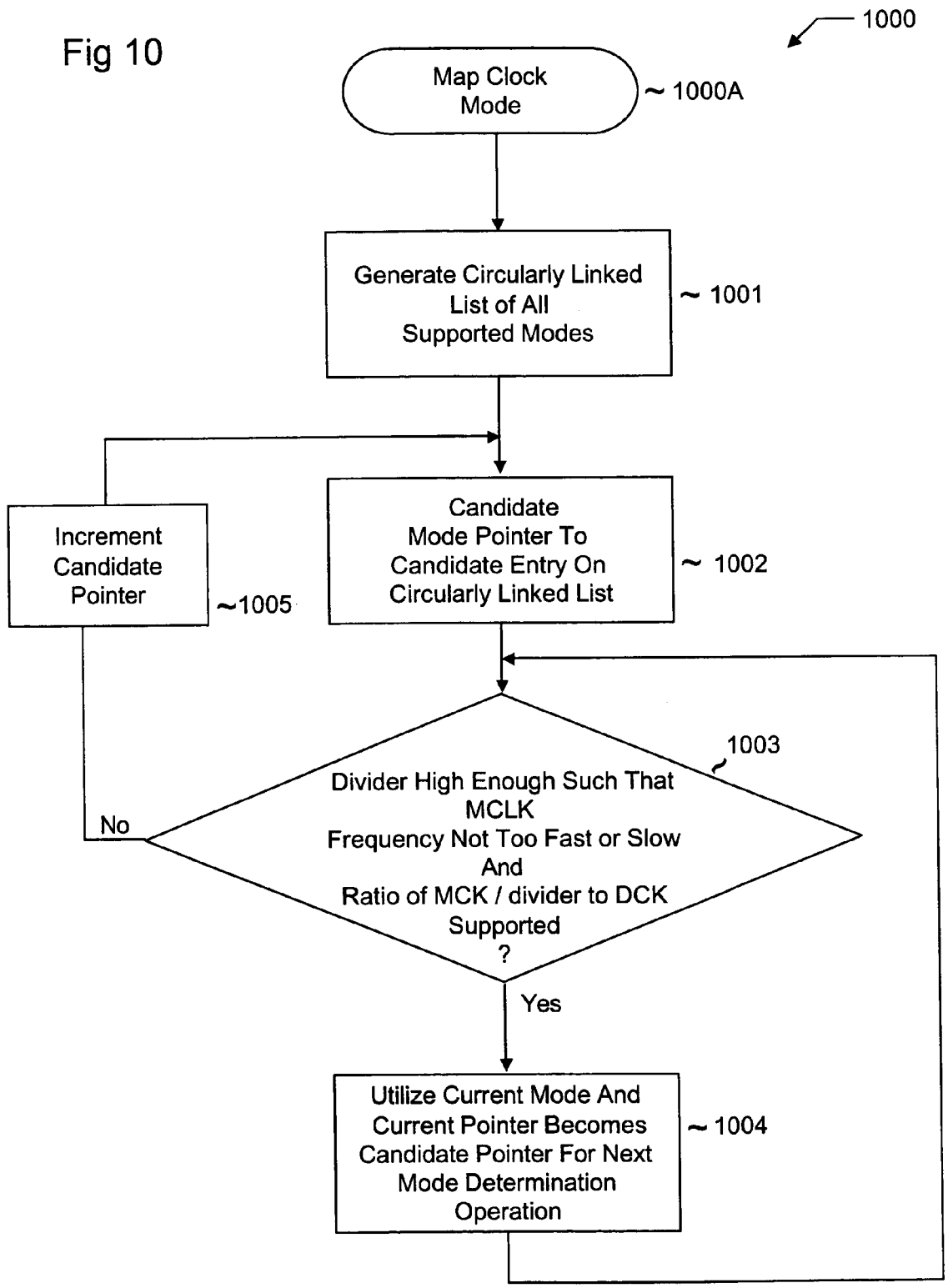

SYSTEMS AND METHODS FOR CLOCK MODE DETERMINATION UTILIZING PRIORITIZATION CRITERIA

CROSS REFERENCE TO RELATED APPLICATION

This application claims priority to Provisional Application Ser. No. 60/574,330, filed May 25, 2004.

The following co-pending and co-assigned applications contain related information and are hereby incorporated by reference:

Ser. No. 11/136,060 by Duewer & Melanson entitled SYSTEMS AND METHODS FOR CLOCK MODE DETERMINATION UTILIZING A FIXED-FREQUENCY REFERENCE SIGNAL, filed May 24, 2005;

Ser. No. 11/136,030 by Duewer, Melanson and Nanda entitled SYSTEMS AND METHODS FOR CLOCK MODE DETERMINATION UTILIZING MASTER CLOCK FREQUENCY MEASUREMENTS, filed May 24, 2005;

Ser. No. 11/135,682 by Duewer and Melanson entitled SYSTEMS AND METHODS FOR CLOCK MODE DETERMINATION UTILIZING HYSTERESIS, filed May 24, 2005;

Ser. No. 11/135,866 by Duewer and Melanson entitled SYSTEMS AND METHODS FOR CLOCK MODE DETERMINATION UTILIZING OPERATING CONDITIONS MEASUREMENT, filed May 24, 2005;

Ser. No. 11/136,059 by Duewer and Melanson entitled SYSTEMS AND METHODS FOR CLOCK MODE DETERMINATION UTILIZING EXPLICIT FORMULAE AND LOOKUP TABLES, filed May 24, 2005; and Ser. No. 11/136,215 by Duewer, Melanson and Nanda entitled SYSTEMS AND METHODS FOR CLOCK MODE DETERMINATION UTILIZING DIVIDE RATIO TESTING, filed May 24, 2005.

FIELD OF INVENTION

The present invention relates in general to mixed signal techniques, and in particular, to systems and methods for clock mode determination utilizing prioritization criteria

BACKGROUND OF INVENTION

Many audio devices, such as audio analog to digital converters (ADCs), digital to analog converters (DACs), and audio encoder-decoders (CODECs), are configured to support multiple clock modes and/or different data formats. For discussion purposes, consider a typical audio device, such as an ADC or CODEC, operating on pulse code modulated (PCM) data and utilizing a serial audio output port. A typical audio serial data port outputs bits of a serial audio data (SDOUT) stream in response to an associated serial clock (SCLK) signal. In a stereo system, two channels of audio data are time-multiplexed onto the SDOUT stream with a left-right clock (LRCK) signal at the audio data sampling frequency (rate). Overall timing is controlled by an external master clock (MCK) signal, which is then often divided in frequency to generate an internal master clock (MCLK) signal for timing internal device operations, for example, filter operations. In the master mode, the SCLK and LRCK clock signals are generated internally, in response to the received MCK signal, and output to the source or destination of the SDOUT stream. In the slave (asynchronous) mode, the SCLK and LRCK clock signals are received from the source or destination of the SDOUT stream, along with the MCLK signal.

Many audio devices support different ratios between the internal master clock (MCLK) signal frequency and the data sampling frequency, which is set by the frequency of a data clock (DCK) signal. (In the PCM audio system described above, the LRCK signal is the DCK signal). One particular desirable feature in DACs is therefore the capability of detecting the data sampling frequency of the incoming digital data stream and subsequently automatically selecting the proper divisor for generating an MCLK signal having a frequency in a desired divide ratio with respects to the DCK signal frequency. In ADCs, the digital output data sampling frequency is often based on the specific system application, and hence it is often desirable to automatically set the proper MCLK rate that produces that output data sampling frequency.

Some existing audio devices require that the user specify whether the DCK signal frequency corresponds to a "single speed", "double speed", or "quad speed" mode. For example, in one typical audio system, if the DCK signal frequency in the single speed mode is up to 48 kHz, then the DCK signal frequency in the double speed mode is between 48 kHz and 96 kHz, and the quad speed mode encompasses all supported DCK signal frequencies above 96 kHz. Once the speed mode is set by the user, a divide ratio for dividing the external MCK signal is selected to produce a corresponding internal MCLK signal frequency having a desired frequency ratio with respect to the DCK signal frequency. For example, in the single speed mode, the MCK frequency to DCK signal frequency divide ratio may be set at a 256×, the divide ratio for the double speed mode set at 128×, and the divide ratio for the quad speed mode set at 64×. Disadvantageously, this conventional technique requires user intervention and/or additional pins on the device for indicating the current speed mode such that an appropriate divisor is selected to divide the MCK signal frequency to produce the desired MCLK signal frequency to DCK signal frequency ratio.

Other currently available devices operate with a single speed mode, and then select the appropriate MCK divide ratio. A significant drawback to this second approach is the limited number of DCK signal frequencies that can be detected when minimizing the size and complexity of the required on-chip circuitry.

Co-assigned U.S. Pat. Nos. 6,492,928 and 6,281,821 to Rhode et al., incorporated herein by reference, utilize both a master clock (MCK) signal and a data clock (DCK) signal, which separates a stream of data samples into at least two (2) channels (i.e. the LRCK signal in the case of a stream of stereo audio PCM data). However, the technique disclosed in the Rhode et al. patents does not measure the absolute rate of the MCK signal, and is therefore is limited in the range of clock modes that can be supported.

Another technique is taught by U.S. Pat. No. 6,556,157 to Itani et al., which is also co-assigned and incorporated herein by reference. The Itani et al. patent describes a clock mode selection circuit that measures the ratio between the LRCK signal frequency and the MCK signal frequency by successively pre-dividing the MCK signal frequency and then checking the resulting frequencies against the LRCK frequency for a valid frequency ratio. Then, the absolute frequency of the MCK signal is measured by pre-dividing it and checking the resulting frequency against an internally generated ramp time. The mode mapping requires that the measurement of the LRCK frequency to MCK frequency ratio to be performed before measuring the absolute MCK signal frequency and utilizes a pre-divide factor common to both measurements. In this case, the output frequency of the pre-divide operation also serves as the internal master clock (MCLK) signal.

U.S. Pat. No. 6,667,704 to Grale et al., incorporated herein by reference, also describes mode control circuits that measure the absolute frequency of the MCK signal by pre-dividing the MCK signal frequency and then checking the resulting divided frequency against an internally generated ramp time. Disadvantageously, the linear components, such as resistors, current sources, and capacitors, utilized in these circuits often vary with such factors as changes in fabrication process and temperature, although the Itani et al. patent briefly mentions that the values of these linear components can be trimmed by calibration.

Given the disadvantages of the existing approaches to selecting the correct operating mode for different data sampling frequencies, improved techniques are required. Such techniques should reduce the amount and complexity of the required on-chip circuitry. Furthermore, these techniques should support a wide range of possible data sampling frequencies and divide ratios across a range of device operating conditions.

SUMMARY OF INVENTION

The principles of the present invention are embodied in systems and methods for determining a system clock operating mode in response to a set of received clock signals. According to one representative embodiment of these principles, a system is disclosed for determining a data converter operating mode, which includes measurement circuitry operable to measure a master clock frequency by comparing a frequency of a master clock signal and a frequency of a fixed frequency clock signal and to measure a frequency ratio between a frequency of a data clock signal and the master clock frequency. A mapping system maps the measurements of the master clock frequency and the frequency ratio to an operating mode of the data converter. In one particular embodiment, the fixed frequency clock signal is provided by an oscillator. In a further embodiment, the master clock signal is generated by multiplying the frequency of another clock signal.

Embodiments of the present principles advantageously directly measure the frequency of a received external master clock signal. In other words, the received external master clock frequency is received un-modified, thereby eliminating the need to perform frequency pre-divide or similar operations on the external master clock signal prior to making frequency measurement operations.

BRIEF DESCRIPTION OF DRAWINGS

For a more complete understanding of the present invention, and the advantages thereof, reference is now made to the following descriptions taken in conjunction with the accompanying drawings, in which:

FIG. 3D is a block diagram of a fourth embodiment of representative clock mode selection and clock signal generation circuitry, which includes bit clock signal frequency measurement circuitry according to the inventive principles;

FIG. 5A is a block diagram of circuitry suitable for trimming/calibrating master clock frequency measurement circuitry embodying the principles of the present invention;

FIG. 5B is a conceptual schematic diagram of current source trimming circuitry suitable for utilization in the trimming/calibration circuitry of FIG. 5A;

FIG. 5C is a conceptual schematic diagram of a resistor trimming circuit suitable for utilization in the trimming/calibration circuitry of FIG. 5A;

FIG. 5D is a block diagram illustrating an embodiment of the inventive principles in which the master clock signal is generated by frequency division of either the data clock signal or the serial clock signal;

FIG. 10 is a flow chart of another representative mode mapping procedures suitable for utilization in the mapping system shown in FIGS. 3A-3E.

DETAILED DESCRIPTION OF THE INVENTION

Figure 1A:
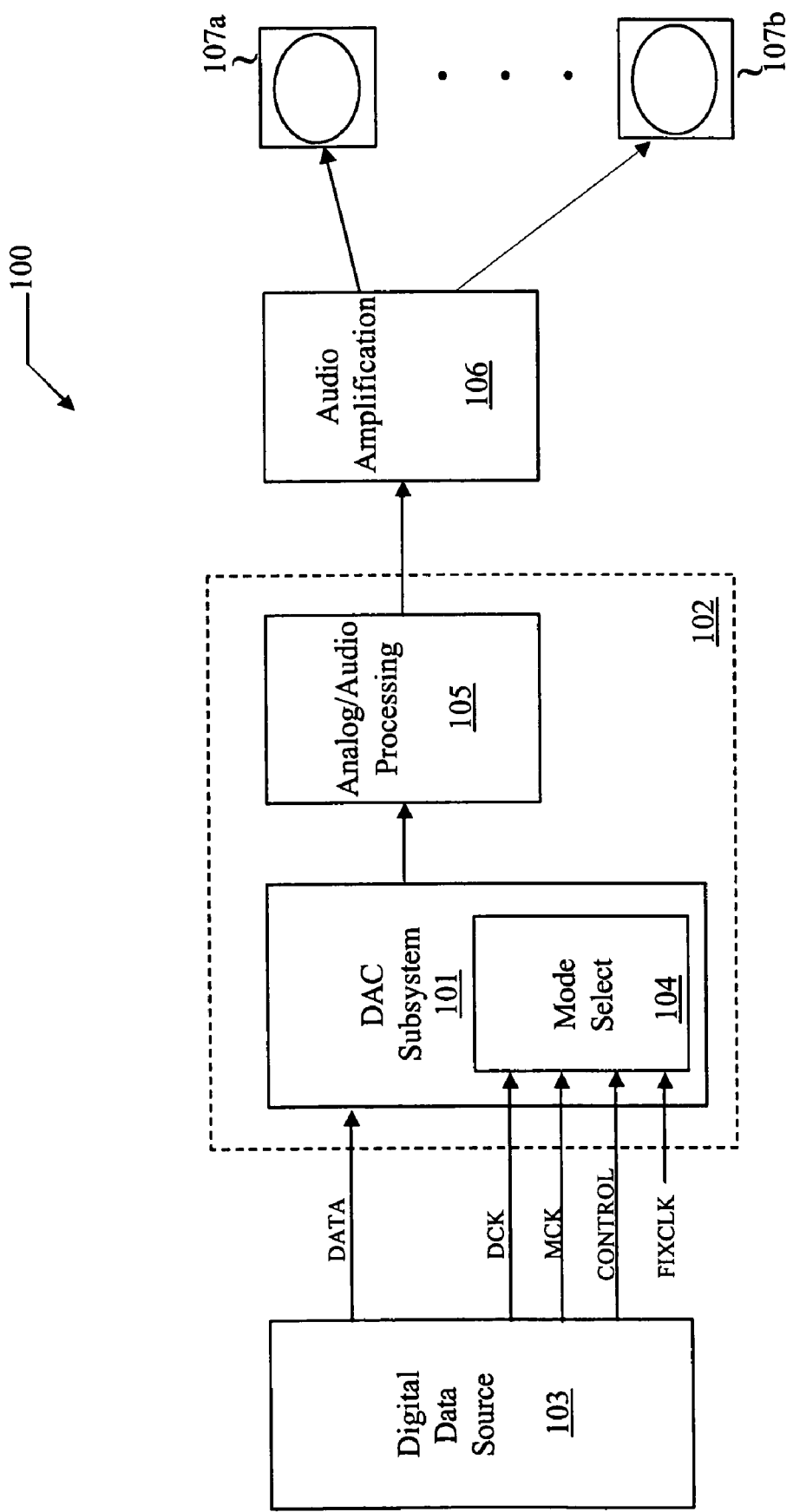
FIGS. 1A-1C are high level block diagrams of a representative audio system suitable for describing typical applications of the principles of the present invention.

The principles of the present invention and their advantages are best understood by referring to the illustrated embodiment depicted in FIGS. 1-11 of the drawings, in which like numbers designate like parts. FIG. 1A is a high level block diagram of a representative audio system 100 suitable for describing one typical application of the principles of the present invention. Audio system 100 includes a digital-to-analog converter subsystem (DAC) 101, which forms part of an audio component 102, such as a compact disk (CD) player, digital audio tape (DAT) player, or a digital versatile disk (DVD) player.

A digital data source 103 provides an input stream of audio digital data (DATA), for example multiple-bit audio data in the pulse code modulation (PCM) format or one-bit audio data in the Sony/Philips Super Audio Compact Disk (SACD) format, from the given digital data storage media (e.g. a CD, DAT, or DVD). Digital data source 103 also provides DAC subsystem 101 with clocks and control signals. The clock signals input into DAC subsystem 101 include the DCK clock signal, which in a PCM audio embodiment of system 100 is the standard left-right clock (LRCK) signal, which times the transfer samples of left- and right-channel audio data. More generally, the DCK signal is any digital stream data (DSD) clock signal having a given DCK frequency that times the transfer of data samples of a given format between devices in a system.

In audio system 100, digital data source 103 also provides the system external master clock (MCK) signal, at a given MCK frequency to DAC subsystem 101; although, in alternate embodiments, the MCK signal may also be generated within DAC subsystem 101. A serial clock (SCLK) signal times the transfer of individual bits of the samples serial audio data. In other applications, the SCLK signal may be another clock signal that operates in conjunction with the DCK signal for transferring digital data in a given format.

In the illustrated embodiment of audio system 100, DAC subsystem 101 also receives a fixed frequency clock (FIXCLK) signal and control signals for utilization by mode select circuitry 104, discussed in further detail below. Generally, mode select block 104 controls the clock operating mode of DAC subsystem 101 required for operation within the given configuration of audio system 100.

The resulting analog (audio) signal output from DAC subsystem 101 undergoes further processing in analog/audio processing circuit block 105 prior to amplification in audio amplification block 106. Amplification block 106 ultimately drives a set of conventional speakers, including speakers 107a and 107b shown in FIG. 1A.

Figure 1B:
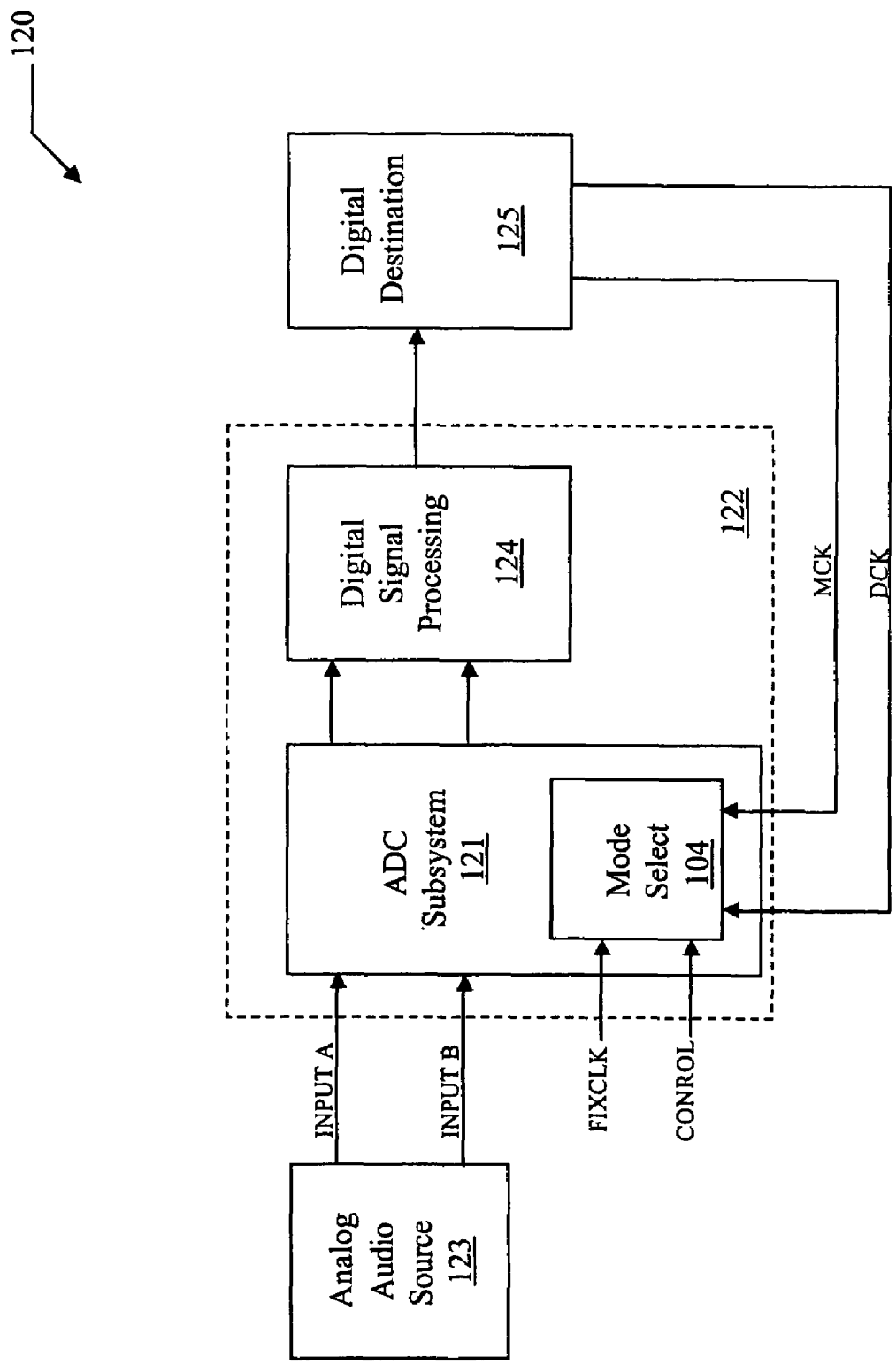

FIG. 1B is a high level block diagram of another representative audio system 120 embodying the principles of the present invention. Audio system 120 includes an analog to digital converter (ADC) subsystem 121, which forms a portion of an audio component 122, such as a CD recorder, DVD recorder, or DAT recorder. In audio system 120, an analog data source 123, for example a microphone or other analog-output audio component, provides two channels of analog audio data (INPUTA and INPUTB) to ADC subsystem 121. ADC subsystem 122 also embodies mode select circuitry 104, described in further detail below.

The digital data, and associated clock signals, generated by ADC subsystem 121 are passed to digital signal processing block 124, and ultimately to digital destination block 125. Digital destination block 125, in a recording embodiment of system 120, includes the circuitry that records the processed digital data onto the given storage media (e.g. a CD, DVD, or DAT). During slave mode operation of audio system 120, as shown in FIG. 1B, digital destination block 125 provides the DCK and MCK signals to mode select block 106 of ADC subsystem 121. In an alternate embodiment, in which ADC subsystem 121 is operating in the master mode, ADC subsystem 121 provides the DCK and MCK signals to digital destination block 125.

Figure 1C:
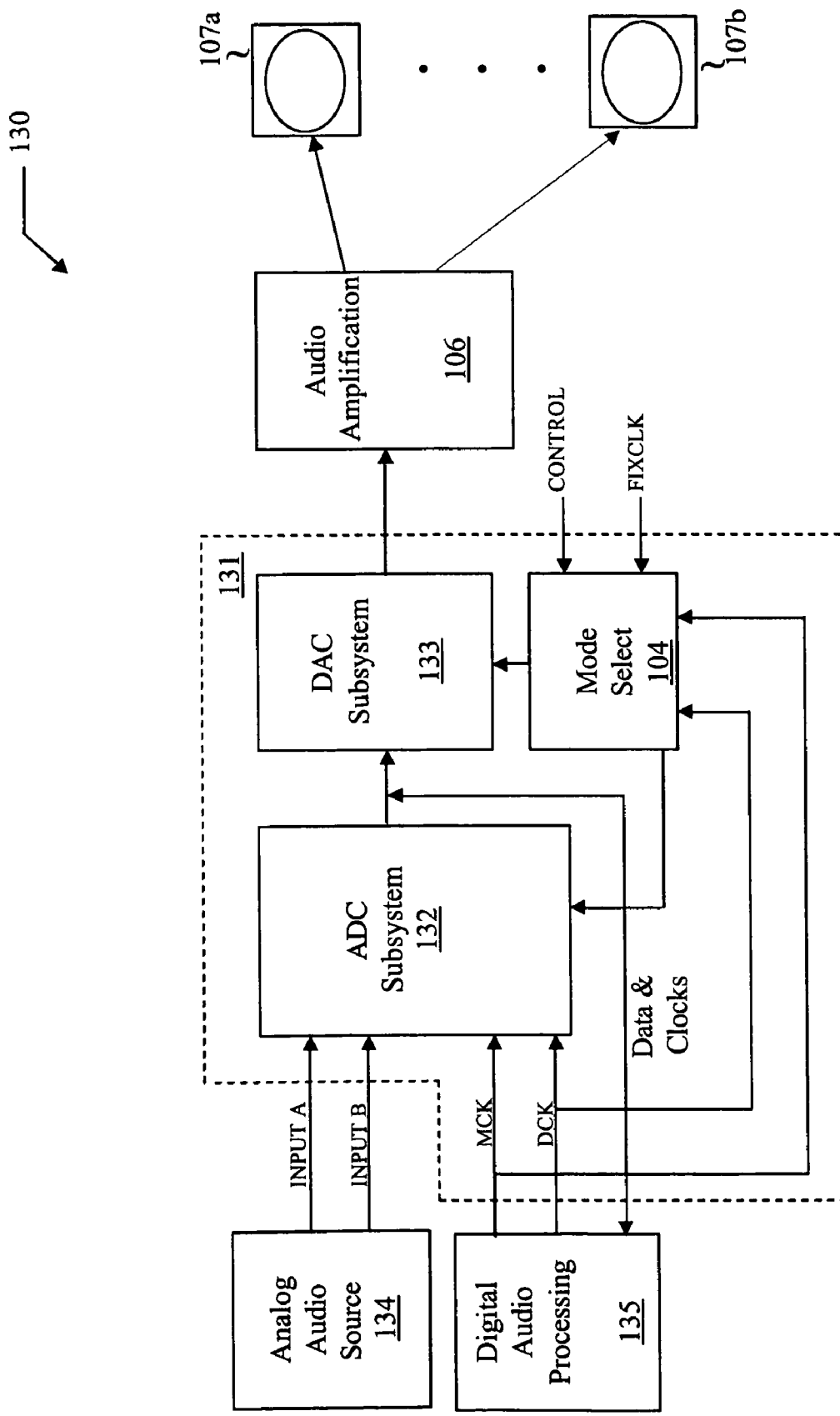

FIG. 1C is a high level block diagram of an additional representative audio system 130 suitable for describing another typical application of the principles of the present invention. Generally, FIG. 1C depicts an audio system 130, which may be, for example, CD or DVD recording and playback system, or a portable MP3 device.

Audio system 130 includes a coder-decoder (CODEC) 131, including an ADC subsystem 132, a DAC subsystem 133, and a mode selection block 104. An analog audio data source 134 provides analog audio data to ADC subsystem 132. A digital storage block 135 both receives digital audio data from ADC subsystem 132 and provides digital audio data to DAC subsystem 133 on the DATA & CLOCKS lines, as timed by the DCK signal. Analog data output from DAC subsystem 133 is amplified by audio amplification block 106, which in turn drives a speaker system, including speakers 107a and 107b. Mode selection circuitry 104 is described in detail below.

Figure 2:
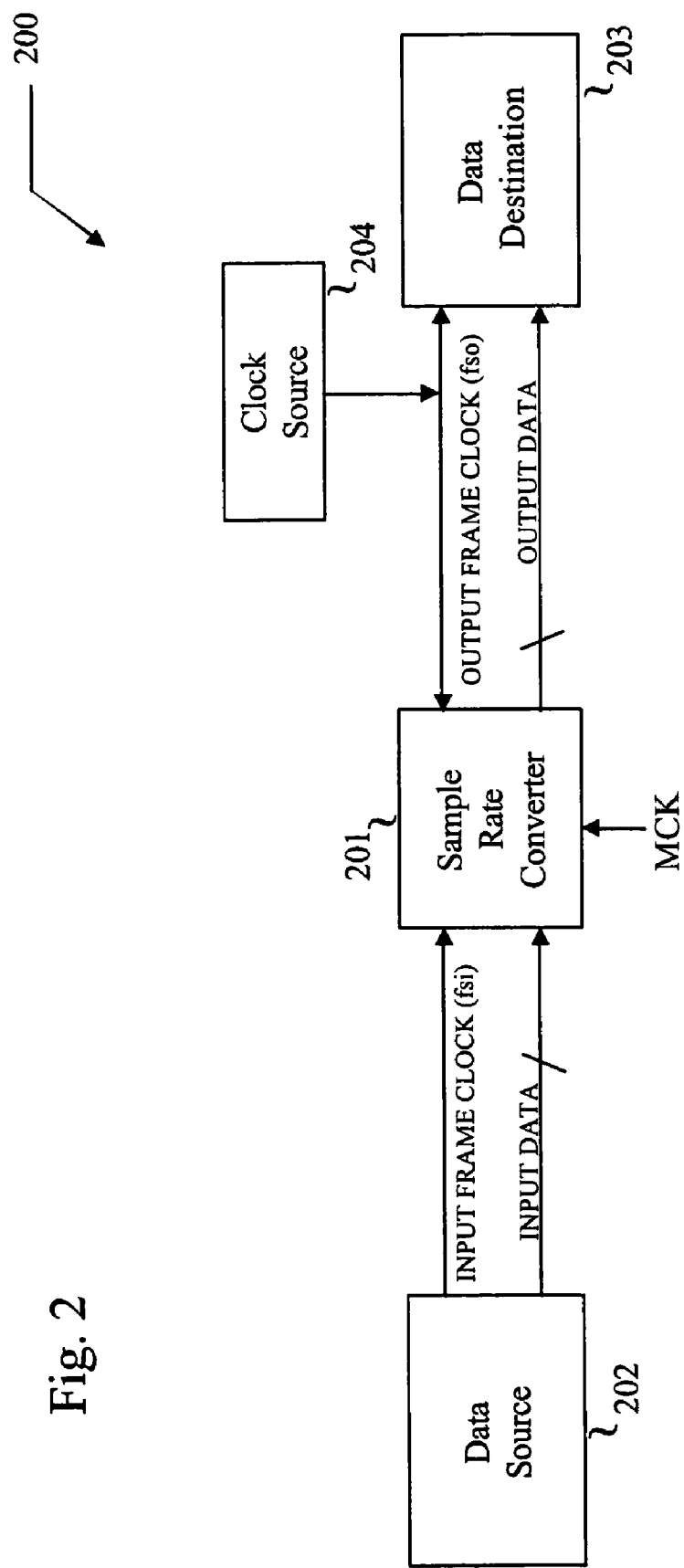
FIG. 2 is a diagram of a representative digital signal processing system including a sample rate converter (SRC), also suitable for describing another typical application of the principles of the present invention.

FIG. 2 is a diagram of a representative digital signal processing system 200 including a sample rate converter (SRC) 201; also suitable for describing representative applications of the inventive principles. Generally, SRC 201 converts the sampling frequency (fsi,) of an input digital data stream (INPUT DATA) provided by a data source 202 to an output digital data stream (OUTPUT DATA) at an output sampling frequency (fso). Data source 202 may be any digital data source, such as a CD or DVD player. The digital data stream output from SRC 201 is provided to a data destination 203, which processes digital data at the output sampling frequency fso.

SRC 201 receives an input frame clock signal from data source 202 having a frequency of fsi and an output frame clock signal having a frequency of fso, which together control sample rate conversion operations. In digital signal processing system 200, a clock source 204 provides the output frame clock signal to SRC 201 and data destination 203. A master clock (MCK) signal, which may be related to the input frame clock, the output frame clock, or neither, is provided to the SRC 201.

In one particular exemplary embodiment, SRC 201 converts the input data into an analog signal and then samples the analog signal at the frequency of fso to derive the digital output data. In this example, an embodiment of mode selection block 104 may advantageously be utilized during the digital to analog and/or the analog to digital conversion operations to configure SRC 201 to properly operate with the provided clock signals. In another exemplary embodiment, SRC 201 converts the digital input data at the fsi frequency directly into digital output data at the fso frequency with the aid of various digital filters, as configured as part of selecting the system operating mode.

FIGS. 3A-3E are high level block diagrams of exemplary clock mode detection and clock signal generation circuits 300, 310, 320, and 330, which are suitable for utilization in mode detection block 104 of FIGS. 1A-1C, and SRC 201 of FIG. 2. The operations of exemplary clock mode detection and clock signal generation circuits 300, 310, 320, and 330 are discussed in detail below.

Figure 3A:
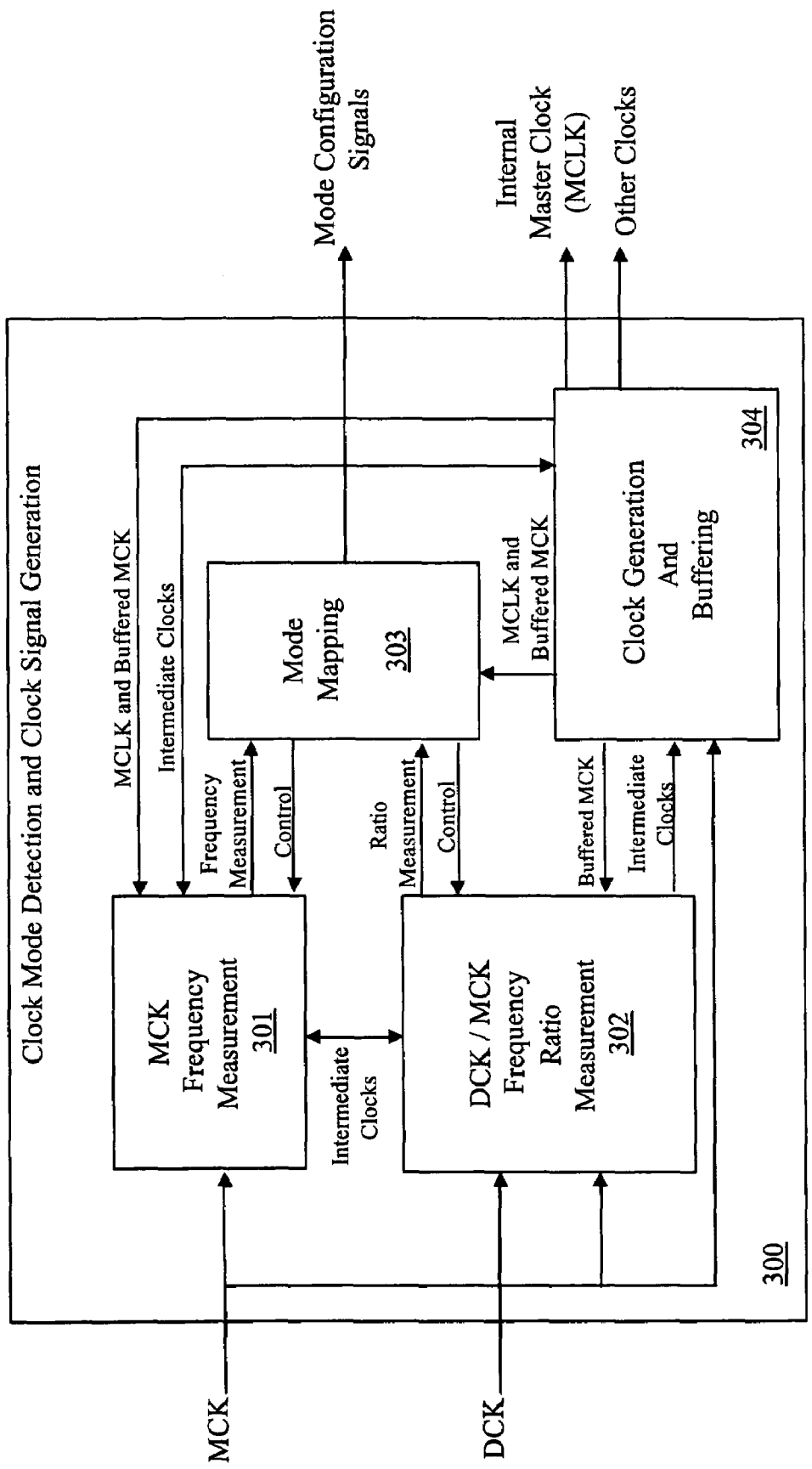
FIG. 3A is a block diagram of a first embodiment of representative clock mode detection and clock signal generation circuitry according to the principles of the present invention.

Generally, clock mode detection and clock signal generation circuit 300 of FIG. 3A includes an MCK frequency measurement block 301, which measures the frequency of the MCK signal. A DCK/MCK frequency ratio measurement block 302 measures the ratio between the frequency of the DCK signal and the frequency of the MCK signal.

Mode Mapping block 303 performs a mapping to an operational mode based on the measurements performed by MCK frequency measurement block 301 and DCK/MCK frequency ratio block. In the course of mapping operations, mapping block 303 provides control and/or feedback signals to the MCK frequency measurement block 301 and DCK/MCK frequency ratio measurement block 302. Mapping block 303 also generates a set of mode configuration signals, which, in the exemplary systems shown in FIGS. 1A-1C and 2, are utilized for configuring on-chip filters and similar clocked circuitry. A clock signal generation and buffering block 304 generates a set of internal clock signals, including an internal master clock (MCLK) signal.

In the illustrated embodiment of clock mode detection and clock signal generation circuit 300, MCK frequency measurement block 301 provides MCK frequency measurement information to Mode Mapping block 303. MCK frequency measurement block 301 receives control signals from Mode Mapping block 303 and the MCLK signal from DCK/MCK frequency ratio measurement block 302. MCK frequency measurement block 301 and DCK/MCK frequency ratio measurement block 302 also exchange intermediate clock signals. Additionally, MCK frequency measurement block 301 receives intermediate clock signals, the MCLK signal, and a buffered MCK signal from signal generation and buffering block 304.

In response to the MCK and DCK signals, DCK/MCK frequency ratio measurement block 302 provides ratio measurement information to Mode Mapping block 303 and intermediate clock signals to signal generation and buffering block 304. DCK/MCK frequency ratio measurement block 302 receives control signals from Mode Mapping block 303 and the buffered MCLK signal from signal generation and buffering block 304. Signal generation and buffering block 304 also provides the MCLK and buffered MCK signals to Mode Mapping block 303.

Figure 3B:
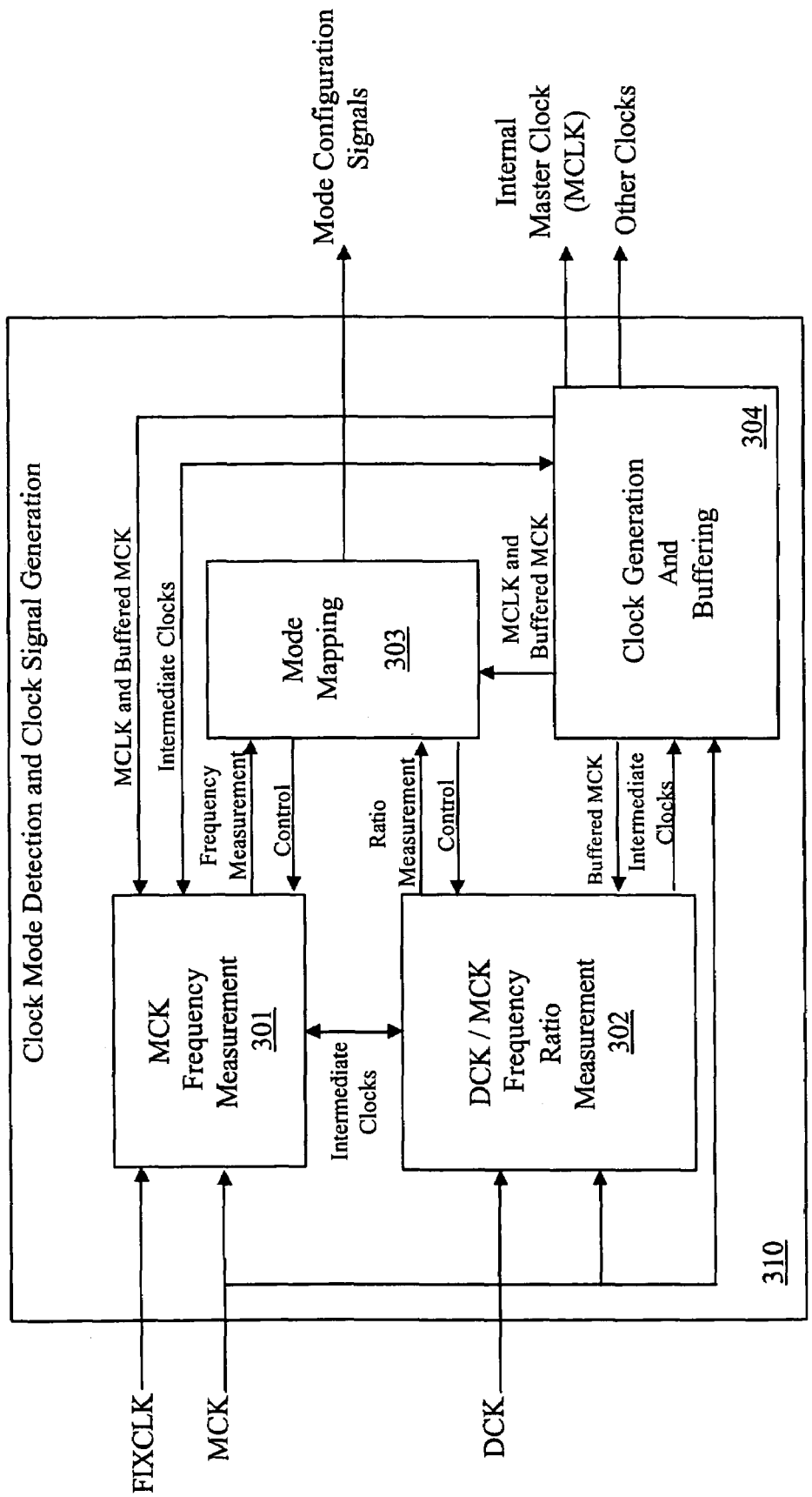
FIG. 3B is a block diagram of a second embodiment of representative clock mode selection and clock signal generation circuitry, in which a fixed-frequency clock signal is utilized in the measurement of the master clock frequency according to the inventive principles.

FIG. 3B shows a second exemplary clock mode detection and clock signal generation circuit 310, according to the inventive principles. Clock mode detection and clock signal generation circuit 310 incorporates the FIXCLK signal discussed above. In particular, in the circuitry of FIG. 3B, the FIXCLK signal, the advantages of which are discussed below, is provided to MCK frequency measurement block 301.

Figure 3C:
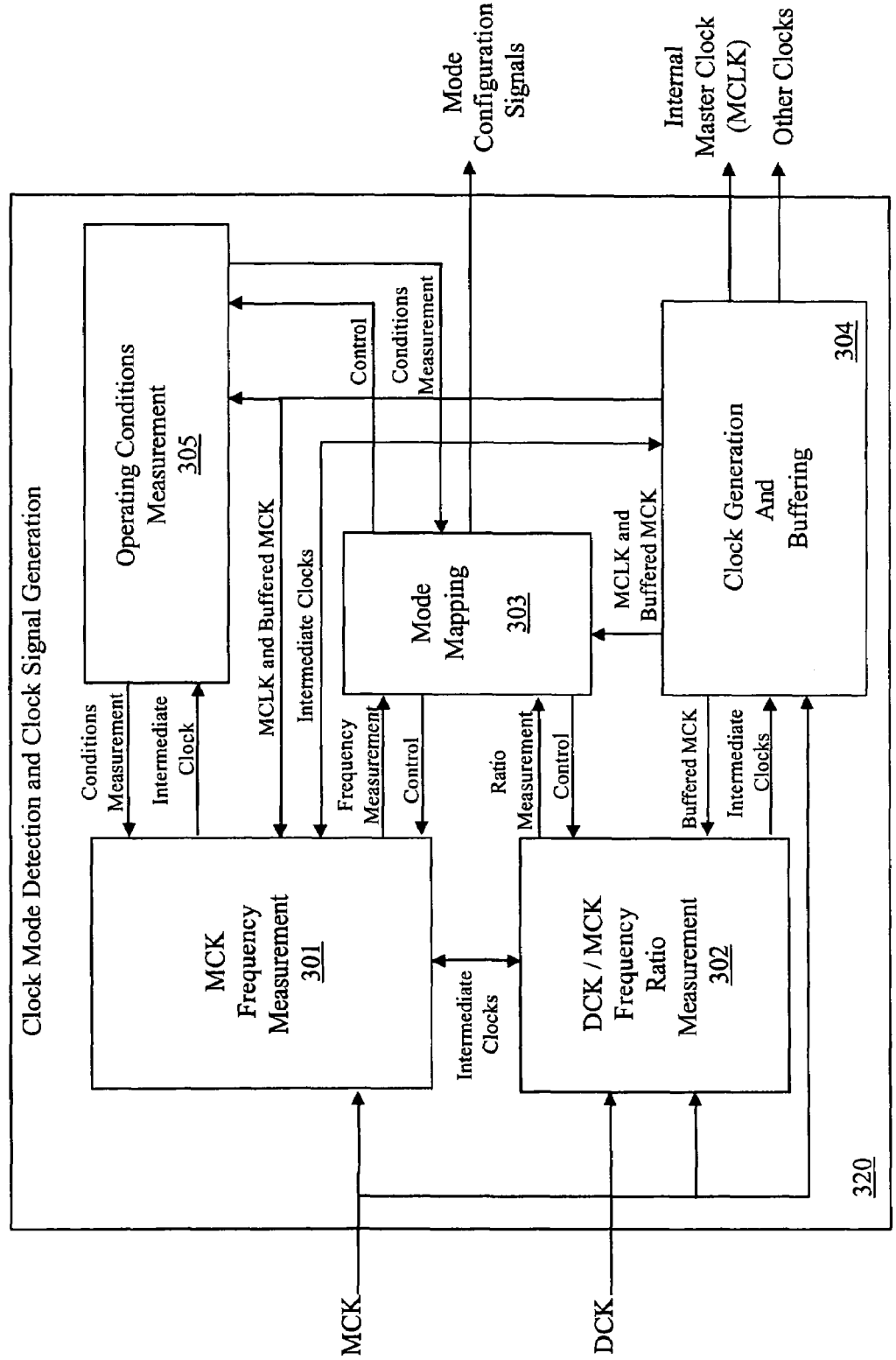
FIG. 3C is a block diagram of a third embodiment of representative clock mode selection and clock signal generation circuitry, which includes operating conditions measurement circuitry according to the inventive principles.

Clock mode detection and clock signal generation circuit 320 of FIG. 3C additionally includes operating conditions measurement circuitry 305, which generally adjusts the frequency measurements performed by MCK frequency measurement block 301 in response to changing operating conditions of the given embodying chip or system. For example, operating conditions measurement circuitry 305 may monitor the temperature of the chip or system, and/or the chip or system supply voltages.

In the embodiment of FIG. 3C, the output from operating conditions measurement circuitry 305 is utilized by mode mapping block 303 during mode mapping. For example, the mapping function implemented by mapping block 303 may change the maximum allowed internal master clock (MCLK) signal frequency based on the digital supply voltage, such that a lower MCLK signal frequency is selected at lower digital supply voltages, and vice-versa. Similarly, the mapping function implemented by mode mapping block 303 may, for example, adjust the measurement of the MCLK signal absolute frequency to take into account the effect of chip temperature on the values of various on-chip circuit elements (e.g. resistors. capacitors, and current sources). In the illustrated embodiment of clock mode detection and clock signal generation circuit 320, operating conditions measurement circuitry 305 provides conditions measurement information to both MCK frequency measurement block 301 and Mode Mapping block 303. Operating conditions measurement block 305 receives intermediate clock signals from MCK frequency measurement block 301 and control signals from Mode Mapping block 303.

In the embodiment of FIG. 3D, clock mode detection and clock signal generation circuit 330 includes an SCLK signal frequency measurement block 306. Generally, SCLK signal frequency measurement additionally allows mapping block 303 and clock generation and buffering block 304 to take into account the frequency of the SCLK signal, typically utilized in PCM audio embodiments, during selection of the proper chip or system clock mode. In alternate embodiments, frequency measurement block 306 may measure the frequency of another clock signal operating in conjunction with the DCK signal to transfer data across a digital data link.

The embodiment of FIG. 3D is particularly advantageous, for example, when the audio data are in a PCM format. In this example, a measurement of the ratio of the SCLK signal frequency to the DCK signal frequency is taken, and for low measured ratios, on-chip filters are selected that consume less power but provide less accuracy. In other words, this embodiment takes advantage of the fact that the data stream has less bits of accuracy and therefore less accurate filters may be utilized to save power.

In the illustrated embodiment of clock mode detection and clock signal generation circuit 330, SCLK frequency measurement block 306 provides SCLK frequency measurement information to block 303 and receives control signals from block 303. MCLK frequency measurement block 306 exchanges intermediate clocks with signal generation and buffering block 304, as well as receives the MCLK and buffered MCK signals from signal generation and buffering block 304.

Furthermore, the ratio of the MCK signal frequency to the SCLK signal frequency may be measured and utilized to avoid MCK signal frequency divide ratios higher than a certain amount when the measured MCK signal frequency to the SCLK signal frequency ratio is too low. For example, in a chip or system requiring an internal MCLK signal frequency to SCLK signal frequency ratio of at least two (2), if the measured MCK signal frequency to the SCLK signal frequency ratio is four (4), then the mapping function only selects modes with a divide ratio of two (2) or less.

In exemplary clock mode detection and clock signal generation circuit 340, shown in FIG. 3E, an additional signal CONFIG supports direct control over the clock mode selection and control process, as discussed in detail below. Generally, the CONFIG signal allows for direct adjustment of the MLK frequency measurement.

Figure 4A:
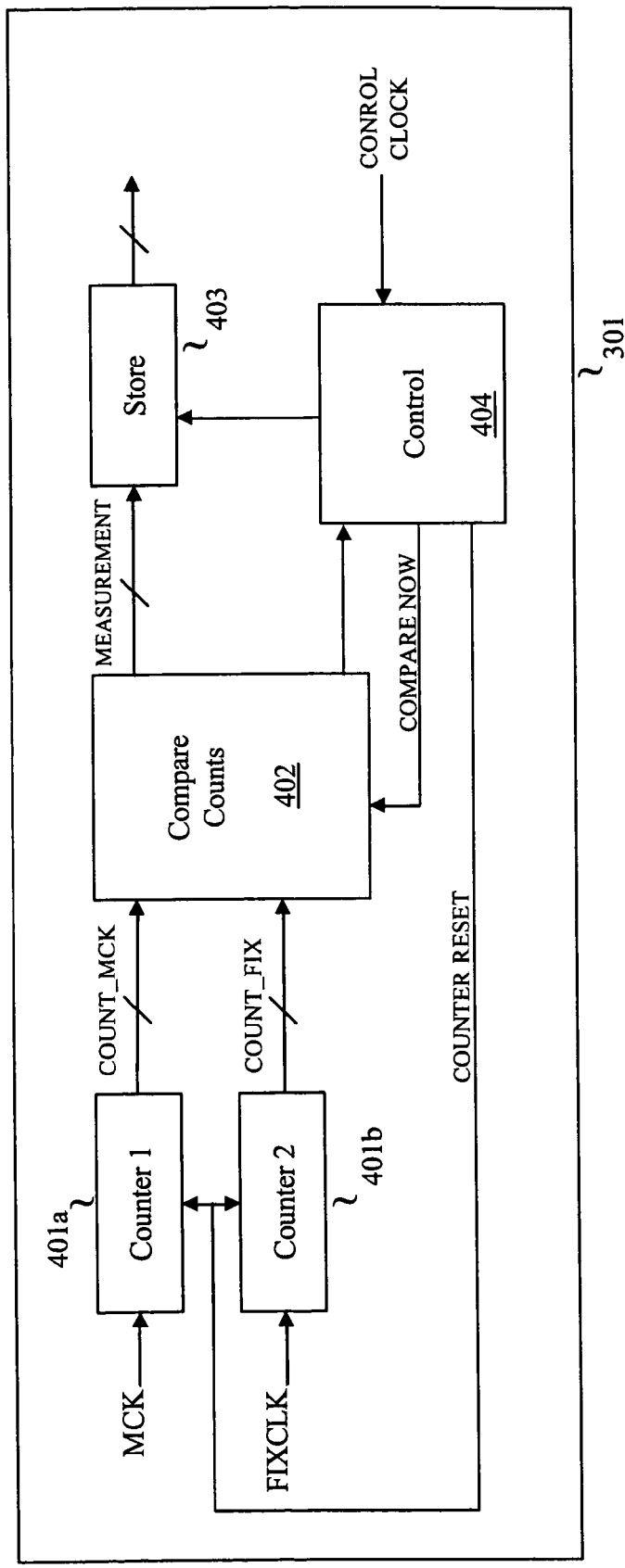
FIG. 4A is a first representative circuit for measuring the master clock frequency according to the inventive principles.
Figure 4B:
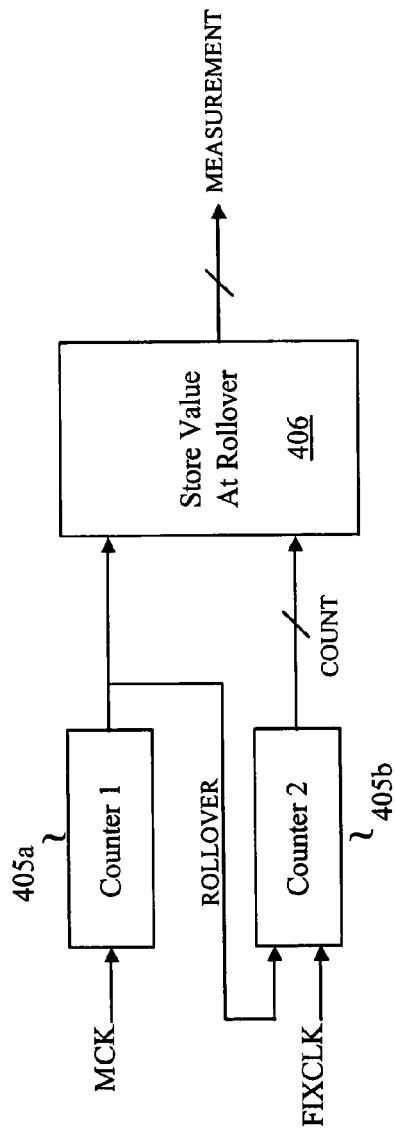
FIG. 4B is a second representative circuit for measuring the master clock frequency according to the inventive principles.
Figure 4C:
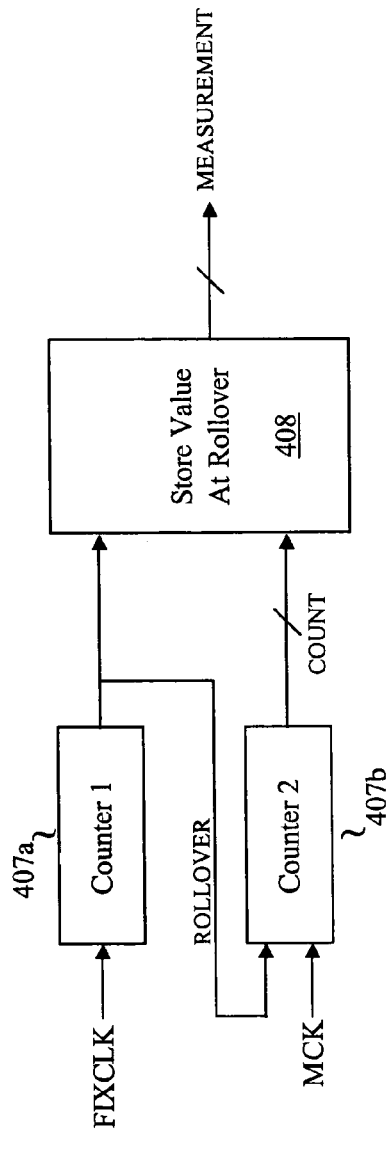
FIG. 4C is a third representative circuit for measuring the master clock frequency according to the inventive principles.

FIGS. 4A-4C are block diagrams illustrating exemplary embodiments of MCK frequency measurement block 301, particularly as configured in clock mode detection and clock signal generation circuit 310 of FIG. 3B to operate in response to the FIXCLK signal. In the circuits shown in FIGS. 4A to 4C, the MCK frequency is directly measured. In other words, the MCK signal goes to the measurement circuit without a change in its frequency.

In the embodiment shown in FIG. 4A, a first counter 401a counts periods of the MCK signal and a second counter 401b counts periods of the FIXCLK signal. The resulting count values COUNT_MCK and COUNT_FIX are compared in comparison (compare counts) block 402, which produces the output signal MEASUREMENT. Each value of the MEASUREMENT signal is stored in storage block 403. A control block 404, running off a control clock (CONTROL CLOCK) signal, determines when to compare the count values COUNT_MCK and COUNT_FIX, store the current value of the MEASUREMENT signal, and reset counters 401a and 401b. The CLOCK CONTROL signal may or may not have a particular relationship to the MCK and FIXCLK signals being measured. In particular, control block 404 makes measurements as frequently as required to provide the mapping function being implemented by mapping block 303 of FIG. 3B with measurements in a timely manner, but also must take enough time to provide the appropriate level of precision for the mapping function chosen for mapping block 303.

Comparison block 402 determines the ratio of the COUNT_MCK and COUNT_FIX count values, and therefore roughly determines which of the FIXCLK and MCK signals have a higher frequency. In turn, the ratio of the COUNT_MCK and COUNT_FIX count values provides information on the externally-generated MCK signal frequency. For higher precision, comparison block 402 performs the measurements that determine the ratio between the COUNT_MCK and COUNT_FIX values to multiple bits of precision and also provides control block 404 with information as to the current count values in counters 401a and 401b, as well as the current comparison operation being performed.

In the embodiment of MCK signal frequency measurement block 301 shown in FIG. 4A, the bit lengths of counters 401a and 401b are preferably selected based on the expected frequencies of the MCK and FIXCLK signals. For example, if the FIXCLK signal frequency is nominally fixed at 27 MHz and the MCK signal frequency ranges from 6 MHz to 54 MHz, the resulting MCK signal frequency to FIXCLK signal frequency ratio preferably varies from 2:9 to 2:1. In one particular embodiment, comparison block 402 divides the COUNT_MCK value by the COUNT_FIX value to determine the frequency ratio. In this case, the lengths of counters 401a and 401b are selected to be five (5) bits each, and control block 404 stops the counting by counters 401a and 401b when the high order bit of either counter 401a or 401b is set. In other words, for a 2:1 MCK frequency to FIXCLK frequency ratio, when counter 401a has a binary value of 10000 (i.e. a decimal 16) and counter 401b has a binary value of 01000 (i.e. a decimal 8), comparison block 402 generates a value MEASUREMENT of 010.000 (i.e. in fixed point notation with the decimal representing 2.0, which corresponds to the 2:1 ratio). As the frequency of the FIXCLK signal is known to be fixed at 27 MHz in this example, the frequency of the MCK signal is consequently determined to be nominally 54 MHz.

In a second alternate counter configuration shown in FIG. 4B, counter 405a, which counts periods of the MCK signal, rolls-over to a zero value when it reaches a certain value. At the roll-over count value, the ROLLOVER signal is sent to counter 405b and storage 406. Storage 406 stores the current count value in counter 405b, and then counter 405b resets. The mapping function implemented by mode mapping block 303 of FIG. 3B utilizes the value MEASUREMENT stored in storage 406, when selecting the appropriate mode of chip operation.

Considering again the exemplary case in which FIXCLK frequency is 27 MHz, the MCK frequency ranges from 6 MHz to 54 MHz, and the ratio of the MCK frequency to FIXCLK frequency varies from 2:9 to 2:1. In the 2:1 case, if counter 405a is a 5-bit counter, then counter 405a rolls-over at a decimal value of thirty-two (32) and counter 405b holds a decimal count of sixteen (16) at the roll-over of counter 405a. In order to size counter 405b, counter 405b must be able to hold the FIXCLK frequency measurement value for the 2:9 case of 9*32/2=144. In other words, counter 405b must have an 8-bit length when counter 405a has a 5-bit width. Thus, if the value of MEASUREMENT stored in the storage 406 is sixteen (16), then the MCK frequency to FIXCLK frequency ratio is 2:1, and if the stored value of MEASUREMENT is one hundred forty-four (144), the MCK frequency to FIXCLK frequency ratio is 2:9.

In the embodiment of FIG. 4C, a counter 407a counts periods of the FIXCLK signal, and at roll-over triggers the storage in storage element 408 of the MCK signal count value in counter 407b. Again, for the example of a FIXCLK frequency of 27 MHz, and a MCK frequency between 6 MHz to 54 MHz, the MCK frequency to FIXCLK frequency ratio varies from 2:9 to 2:1. In the case of a 2:1 ratio, if counter 407a has a length of five (5) bits, and consequently rolls-over at a count of thirty-two (32), then counter 407b holds a count of sixty-four (64) at the roll-over of counter 407a. Hence, counter 407b must have a length of at least seven (7) bits, for the measurement of the 2:1 ratio. For the case of a 2:9 MCK frequency to FIXCLK frequency ratio, counter 407b must be able to support the measurement of 2*32/9, which also requires a counter length of seven (7) bits.

Additionally, the precision of the MCK frequency measurements in the exemplary embodiments of FIGS. 4A-4C depends on the size of the respective counters 401a-401b, 405a-405b, and 407a-407b. The non-synchronous nature of the MCK and FIXCLK signals being compared in frequency means that the values in counters 401a-401b, 405a-405b, and 407a-407b for a given MCK frequency measurement may vary slightly.

Furthermore, various other characteristics must be considered during the selection of the lengths of counters 401a-401b, 405a-405b, and 407a-407b to achieve the proper level of precision without overflow. For example, in the embodiments of FIGS. 4B and 4C, in which counters 405a and 407a control associated counters 405b and 407b, counters 405b and 407b must be sized to avoid overflow of corresponding counters 405a and 407a. In the embodiment of FIG. 4A, the options available for determining when to stop the counting by counters 401a and 401b and do a compare operation are wider, and the potential to use a third clock signal for the control process allows for measurements to be produced at intervals convenient to other chip functions.

In alternate embodiments of the circuits shown in FIGS. 4A-4C, an oscillator output signal provides the FIXCLK signal. The accuracy to which the oscillator frequency is known may be less than that of a supplied known frequency clock signal, and thus resulting achievable accuracy of the MCK frequency measurement will also be affected.

MCK frequency measurement techniques, suitable for utilization in MCK frequency measurement block 301 of FIGS. 3A-3E, and which rely on analog circuit elements to perform one or more measurements, are preferably calibrated by the circuitry shown in FIGS. 5A-5C. For example, if an oscillator generates the FIXCLK signal shown in FIGS. 4A to 4C, the circuits of FIGS. 5A-5C allow the oscillation frequency to be trimmed during calibration. Additionally, FIG. 5D illustrates that the MCK signal may be generated by directly multiplying in frequency either the DCK signal or the SCLK signal.

FIG. 5A shows an exemplary method for adding additional blocks around a selected MCK frequency measurement block 301 to facilitate calibration. A multiplexer (mux) 501 allows selection of a clock signal of known frequency during calibration. A control signal CONTROL adjusts associated calibration circuitry 502 until the output MEASUREMENT reaches the expected measurement value for the known clock signal frequency.

In order to trim MCK frequency measurement circuit 301, the individual current sources, resistors, and/or capacitors within MCK measurement block 301 are trimmed. FIG. 5B illustrates trimming a fixed current source 503 by adding a parallel variable current source 504. FIG. 5C demonstrates trimming a resistor 505 by adding series resistance, including exemplary resistances 506a and/or 506b.

FIG. 5D illustrates an exemplary circuit in which the external master clock (MCK) is generated by direct frequency multiplication of either the DCK signal or the SCLK signal. The frequency multiplication is performed, using a simple multiplier circuit or a phase-locked loop (PLL).

Figure 3E:
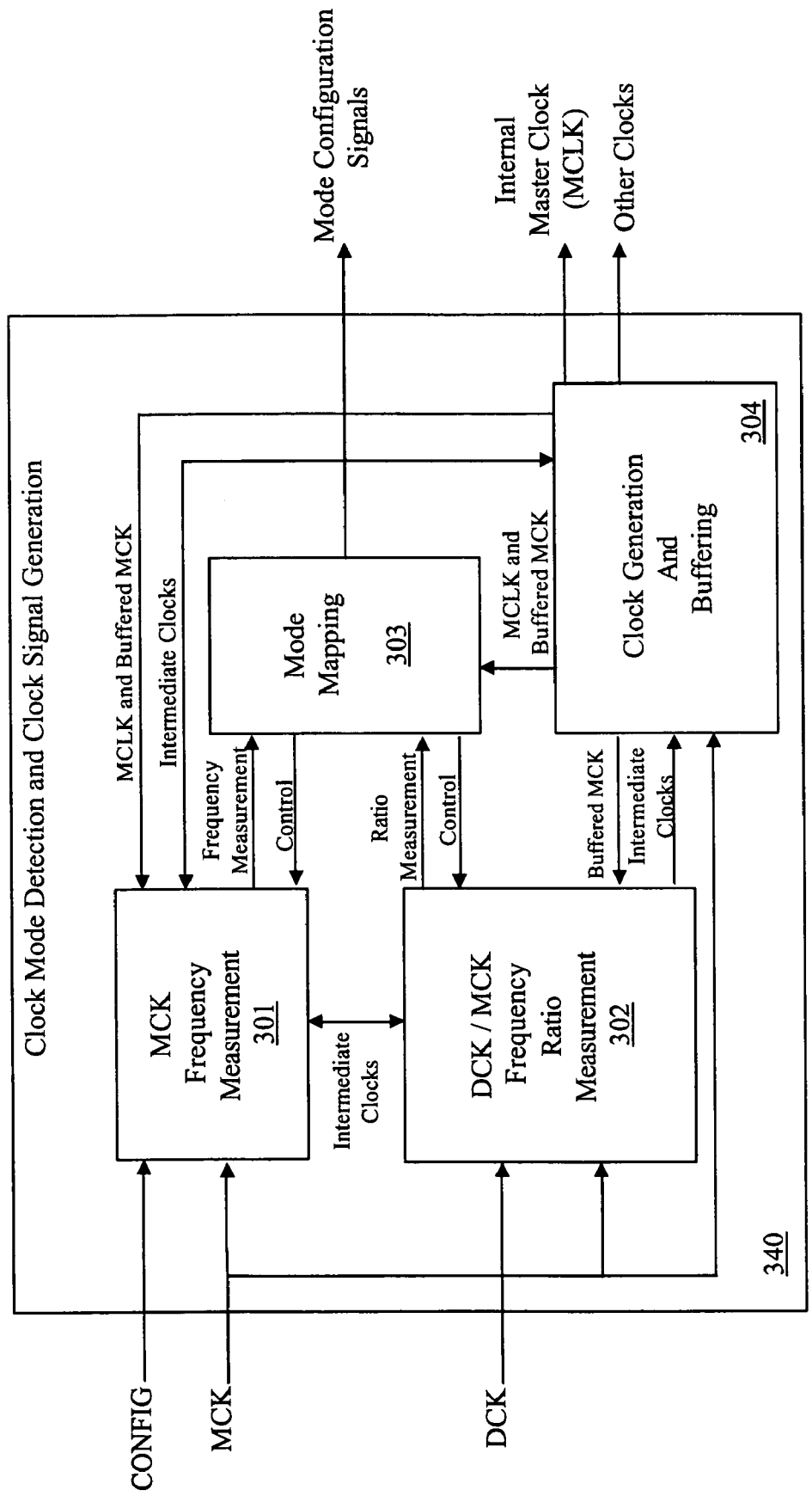
FIG. 3E is a block diagram of a fifth embodiment of representative clock mode selection and clock signal generation circuitry, which allows for direct adjustment of the master clock signal frequency measurement.

In clock mode detection and clock generation circuit 340 of FIG. 3E, the CONFIG input to MCK frequency measurement block 301 adjusts the measurement of the MCK frequency. In one embodiment, the CONFIG input varies the trip points at which the MCK frequency is considered too high and/or too low. For example, one particular configuration may utilize trip points suitable for data streams with sample rates that are power-of-two multiples of 48 kHz, while another system configuration may require trip points suitable for data streams with sample rates that are power-of-two multiples of 32 kHz. This feature advantageously allows two families of sample rates to be distinguished with a single additional external configuration pin, instead of requiring several pins or a control port to designate the sample rate.

Figure 6:
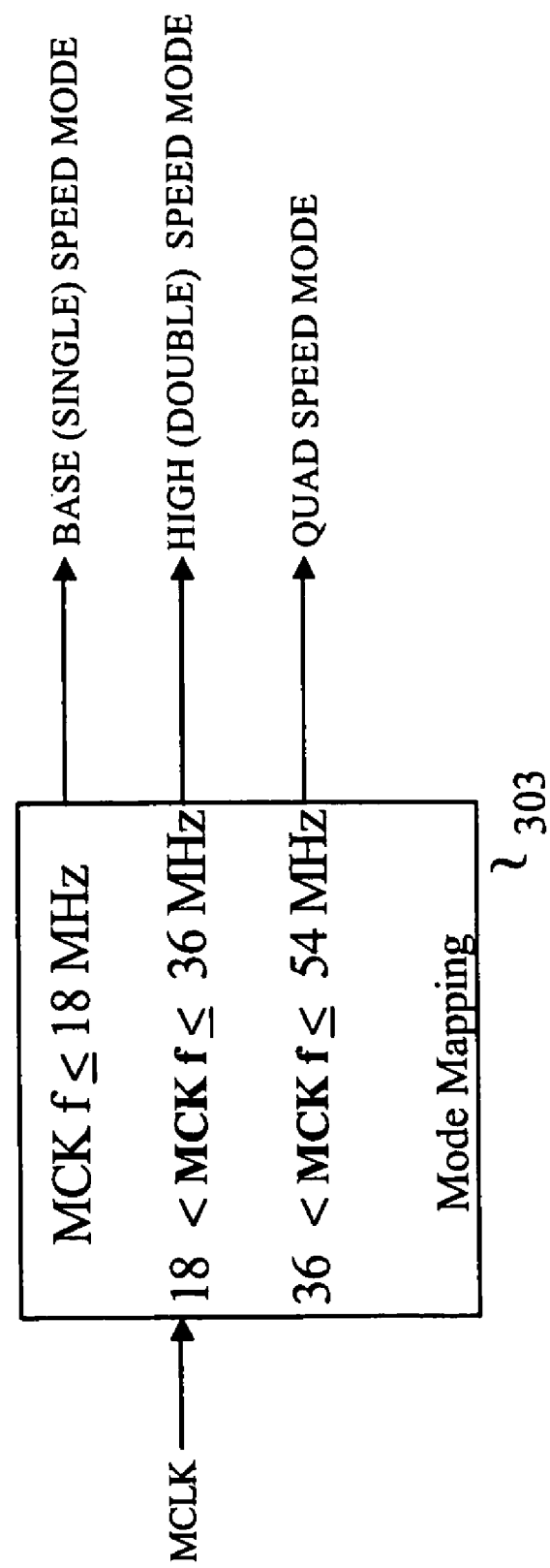
FIG. 6 is a block diagram of an exemplary mode mapping system according to the inventive principles, in which only the master clock frequency is utilized during mapping.

FIG. 6 is a block diagram of an exemplary embodiment of mode mapping block 303 of FIGS. 3A-3E, which utilizes a mapping function that utilizes the measurement of the MCK frequency, but does not require a measurement of the DCK frequency to MCK frequency ratio. In exemplary clock mode detection and clock signal generation circuits 300, 310, 320, 330, and 340 shown in FIGS. 3A-3E, the DCK frequency to MCK frequency ratio measurement block 303 is consequently disabled or eliminated.

In the embodiment of mode mapping block 303 shown in FIG. 6, the ratio of the DCK frequency to MCK frequency is assumed to be a fixed ratio R, which is selected by user input configuration information or through an on-chip bond option. With the DCK frequency to MCK frequency ratio set to ratio R, the MCK frequency is directly compared against thresholds (trip points) to determine the chip operating mode. In the example of FIG. 6, if the MCK frequency is less than or equal to 18 MHz, the base (sample) speed operating mode is selected. For MCK frequencies greater than 18 MHz but less than or equal to 36 MHz, a high (double) speed operating mode is selected, and for MCK frequencies greater than 36 MHz but less than or equal to 54 MHz, a quad speed mode is selected.

Figure 7B:
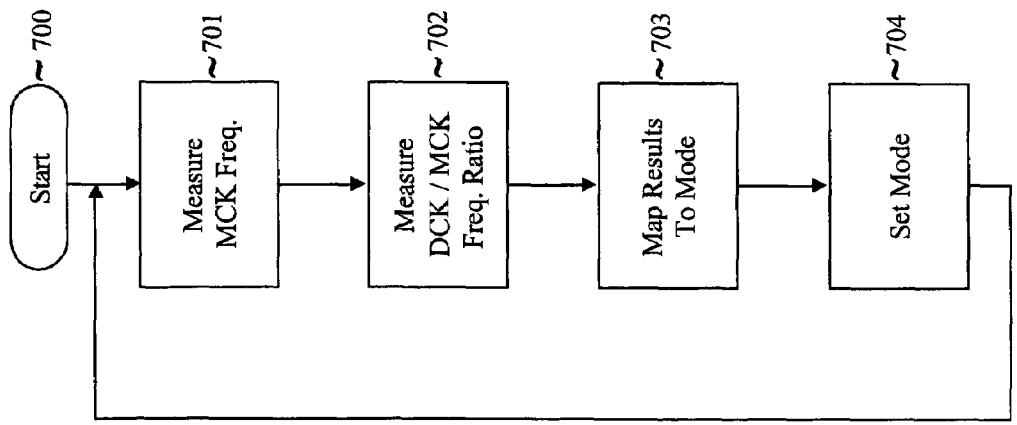
FIGS. 7A AND 7B, respectively, are flow charts illustrating exemplary mode mapping sequences according to the inventive principles.
Figure 7A:
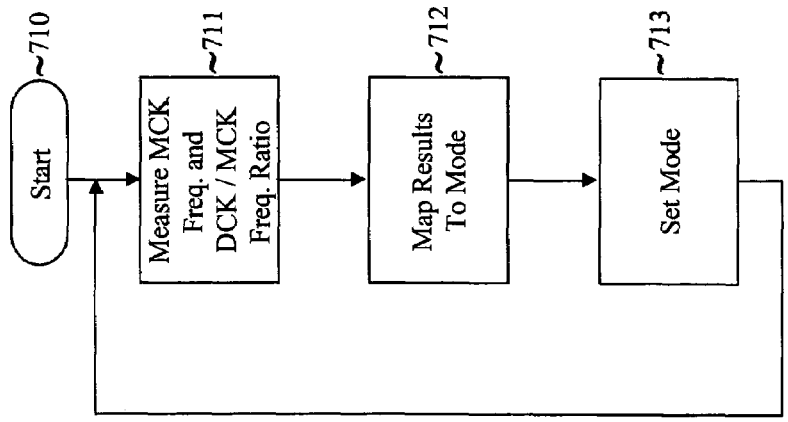

FIGS. 7A and 7B are two flow charts describing alternate orderings of MCK frequency and DCK frequency to DCK frequency ratio measurements performed in exemplary clock mode detection and clock signal generation circuits 300, 310, 320, 330, and 340 shown in FIGS. 3A-3E.

In procedure 700 shown in the flow chart of FIG. 7A, the MCK frequency is measured in MCK frequency measurement circuit 301 prior the measurement of the ratio of the DCK frequency to the MCK frequency in DCK/MCK frequency ratio measurement block 302. Specifically, the given clock mode detection and clock signal generation circuit 300, 310, 320, 330 is reset at start up and the appropriate variables are initialized. At block 701, the measurement of the MCK frequency is performed and, at block 702, the measurement of the DCK frequency to frequency ratio is taken, preferably utilizing information from the MCK frequency measurement to assist with the ratio measurement process. At block 703, the results of these measurements are utilized by mode mapping system 303 to select a chip operating mode, which is then set in block 704. Procedure 700 either repeats automatically to detect changes in the MCK frequency and/or the DCK to MCK frequency ratio. Alternately, procedure 700 repeats if an operating error is detected on-chip.

In procedure 710 shown in the flow chart of FIG. 7B, both the MCK frequency measurement and the DCK frequency to MCK frequency measurements are performed simultaneously and independently at block 711. The corresponding operating mode is next selected at block 712, and then set at block 713. Procedure 710 either repeats automatically to detect changes in the MCK frequency and/or the DCK to MCK frequency ratio, or if an operating error is detected on-chip.

Figure 8A:
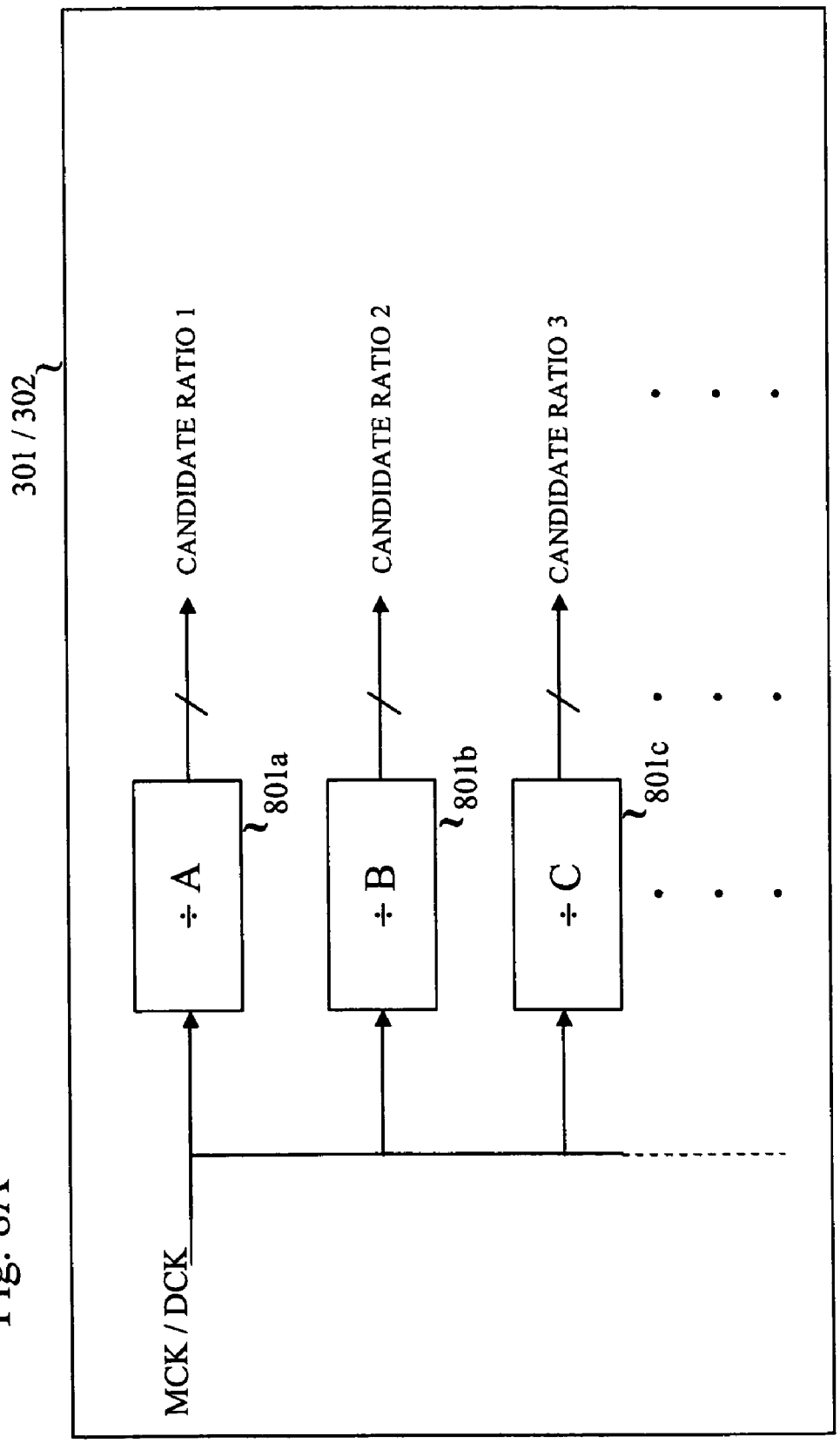
FIGS. 8A AND 8B are block diagrams showing representative master clock frequency and data clock frequency to master clock frequency ratio measurement circuitry according to the inventive principles and suitable for application in the clock mode detection and clock signal generation circuitry shown in FIG. 3B.
Figure 8B:
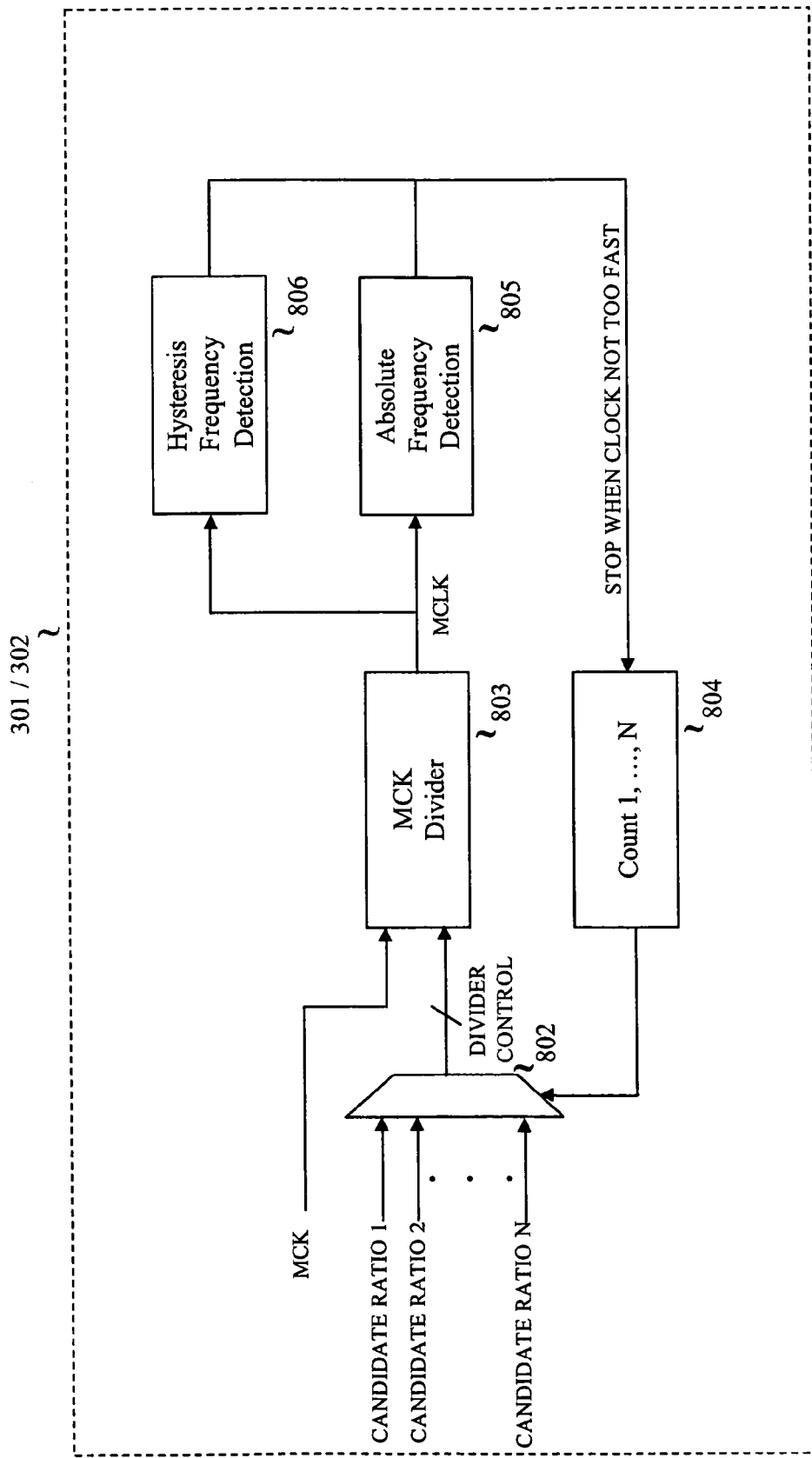

FIGS. 8A and 8B are block diagrams of an exemplary embodiment of MCK frequency measurement block 301 and DCK frequency to MCK frequency ratio measurement block 302 of clock mode detection and clock signal generation circuits 300, 310, 320, 330, and 340 shown in FIGS. 3A-3E.

In FIG. 8A, a plurality of fixed dividers, including exemplary fixed dividers 801a-801c, respectively, divide the DCK frequency to MCK ratio by DCK frequency to MCLK frequency ratios supported by the on-chip filters. From the outputs of fixed dividers 801a-801c, a list of candidate divide ratios is created, ordered from the smallest ratio to the largest ratio. Generally, these candidate ratios are selected as required to support the various on-chip filters utilized during different operating modes.

In FIG. 8B, the candidate ratios are provided to the input of a multiplexer (mux) 802, from which one candidate ratio is selected as a control input to an MCK divider circuit 803. Divider circuit 803 divides the MCK frequency by each divide ratio selected by multiplexer 801. A counter 804 generates control signals that control multiplexer 802 by cycling through the candidate ratios until it reaches one which results in an MCLK signal frequency which is not too fast, as measured by an absolute frequency detection circuit 805. Assume that the input DCK frequency to MCK frequency ratio is 1024, the MCK frequency is 25 MHz, the maximum supported MCK frequency is 25 MHz, and the desired ratios of the DCK frequency to the MCK frequency are 64, 128, and 256. Consequently, the candidate divide input to multiplexer 802 ratios are 16, 8, and 4. Since 4 is the smallest of the divide ratios, it is tried first, which results in an MCK frequency of 6.25 MHz. Since 6.25 MHz is not too fast (i.e. is less than the maximum supported MCK frequency of 25 MHz), the chip mode selected is divide by 4 such that filters operating with a 256 ratio of the DCK frequency to the MCK frequency are selected.

Figure 8C:
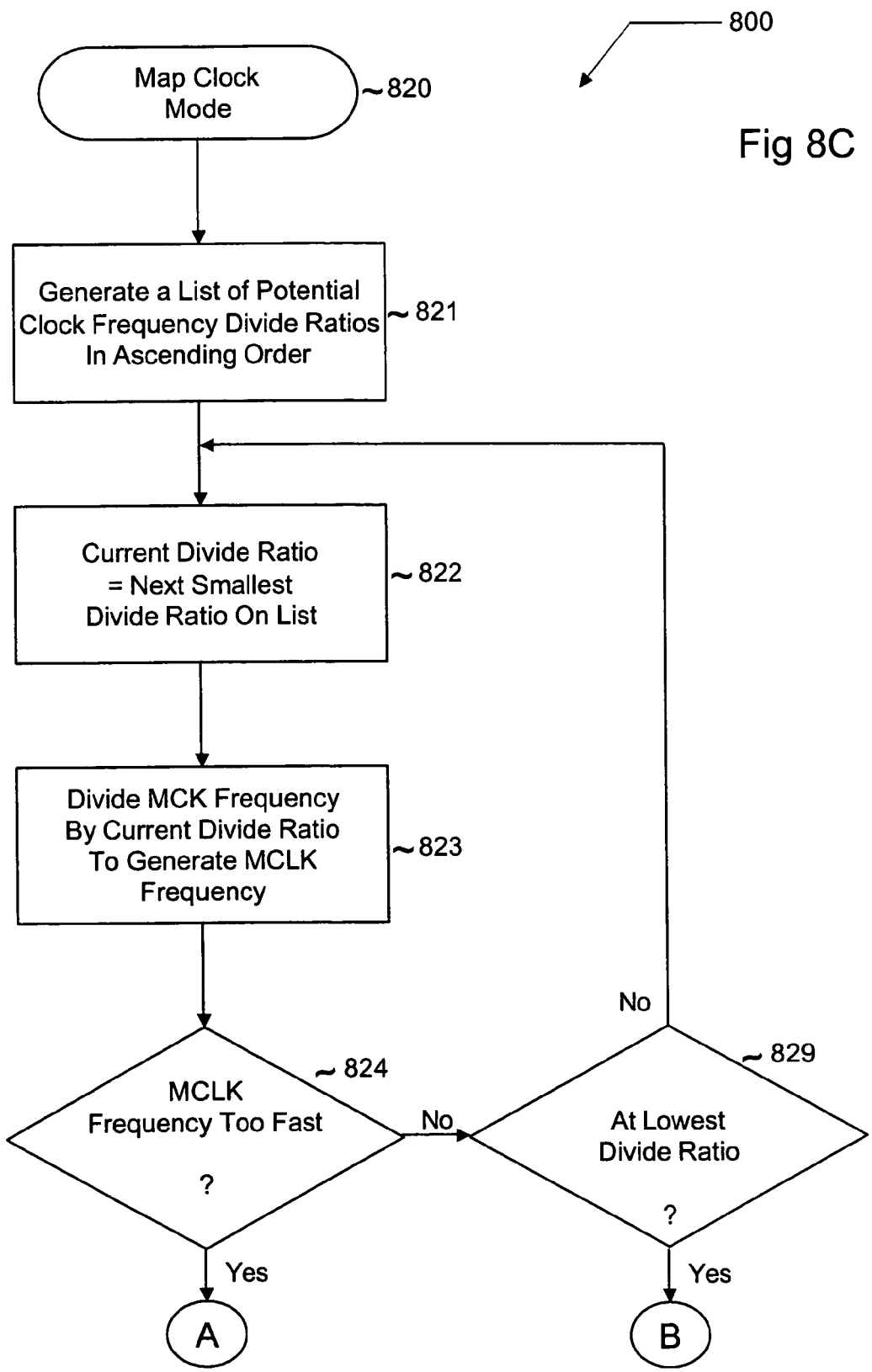
FIGS. 8C and 8D are flow charts of respective exemplary mode mapping procedures suitable for utilization in the circuitry shown in FIGS. 8A and 8B.
Figure 8C:
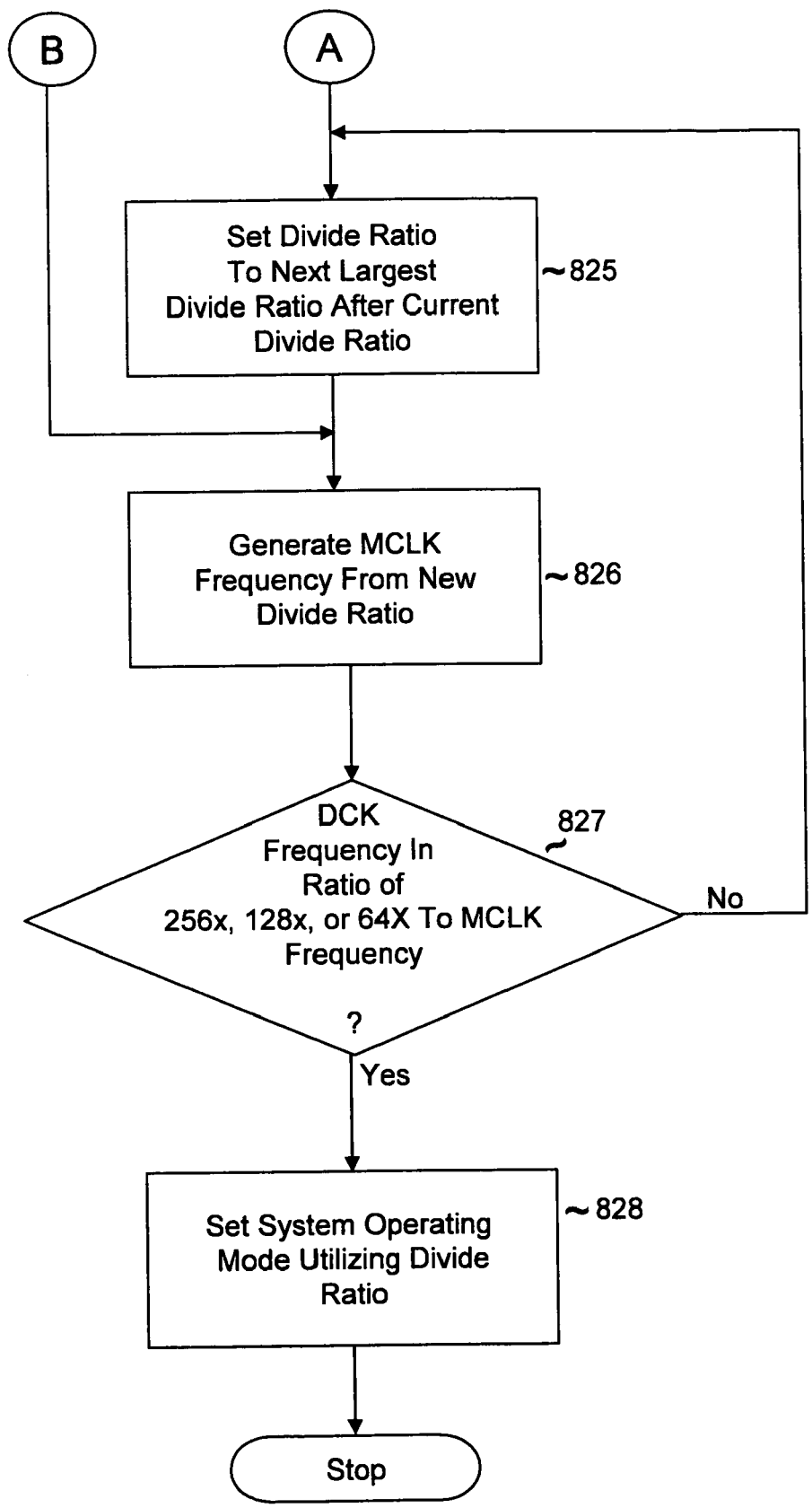

FIG. 8C is a flow chart of an exemplary mode mapping procedure 820 that may be applied to the embodiments of MCK frequency measurement block 301 and DCK frequency to MCK frequency ratio measurement block 302 illustrated in FIGS. 8A and 8B. In particular, mode mapping procedure 800 cycles from the last element in the candidate ratio list (i.e. the highest candidate ratio).

Clock mode mapping starts at block 820. At block 821, a list is generated of potential clock frequency divide ratios sorted in ascending order. The current divide ratio at block 822 is the next smallest ratio on the list, which is the last (highest) ratio on the list for the first iteration of procedure 800. The current divide ratio is then utilized at block 823 to divide the MCK frequency to generate a candidate MCLK frequency.

At block 824, a check is made to determine whether the candidate MCLK frequency is too fast. If the MCLK frequency is not too fast, and at block 829 the current divide ratio is not the lowest divide ratio, then procedure 820 returns to block 822, the next smallest ratio on the list becomes the current ratio, and the operations at blocks 823 and 824 are repeated.

Otherwise, if the MCLK frequency is too fast at block 824, procedure 820 moves to block 825. Alternatively, if the MCLK frequency is too fast at block 824 and the current divide ratio is not the lowest divide ratio at block 829, then procedure 820 jumps to block 826.

At block 825, the divide ratio is set to the next largest divide ratio in the list and a new candidate MCLK frequency is generated at block 826. A determination is then made at block 827 as to whether the DCK frequency is in a ratio of 256×, 128× or 64× to the new candidate MCLK frequency. If the DCK frequency is in a ratio of 256×, 128× or 64× to the candidate MCLK frequency, then the candidate MCLK frequency is utilized in the system operating mode at block 828. Otherwise, procedure 800 returns to block 825 and the next largest divide ratio on the list is taken and the operations at blocks 826 and 827 repeated.

Figure 8D:
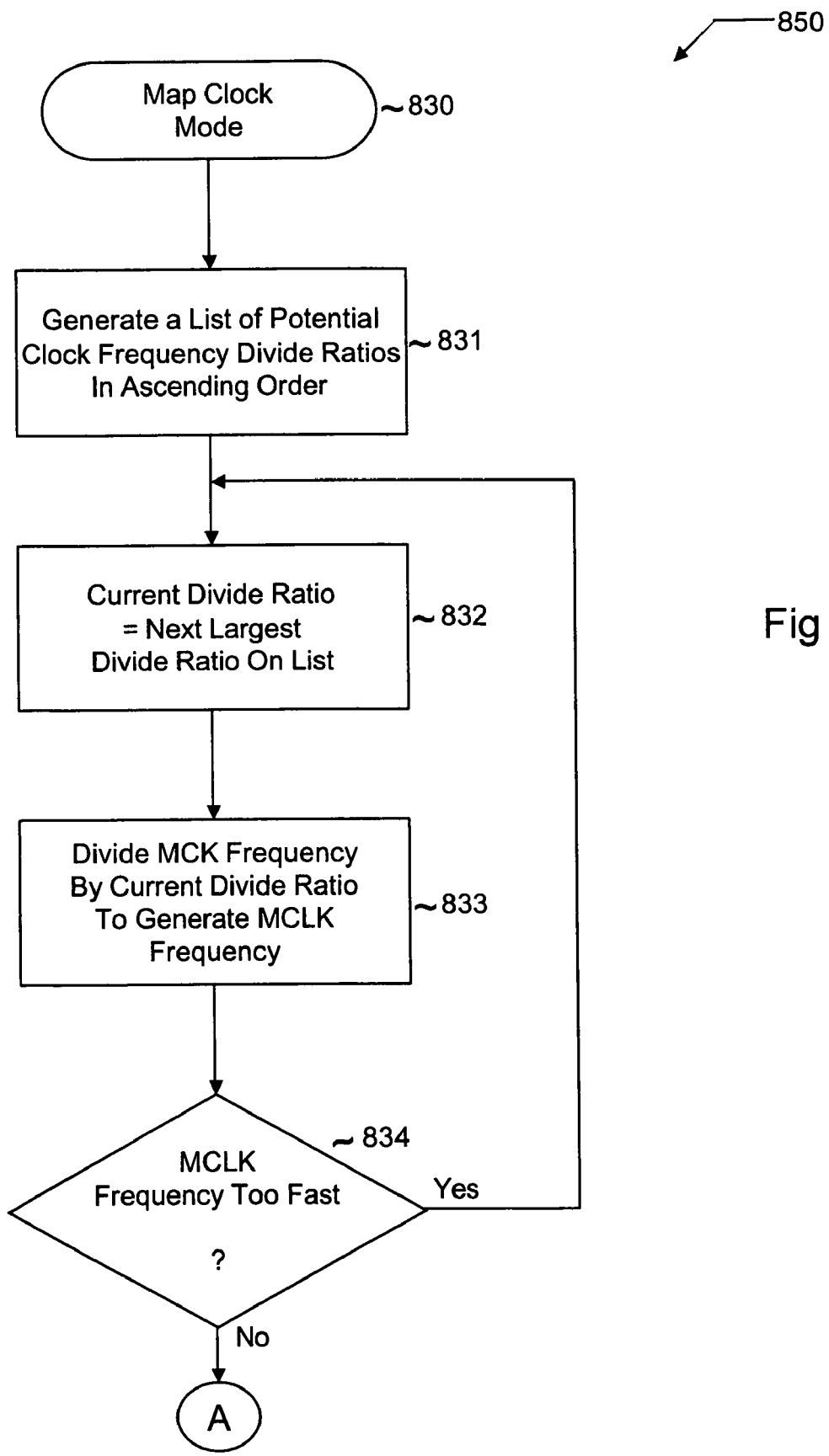
Figure 8D:
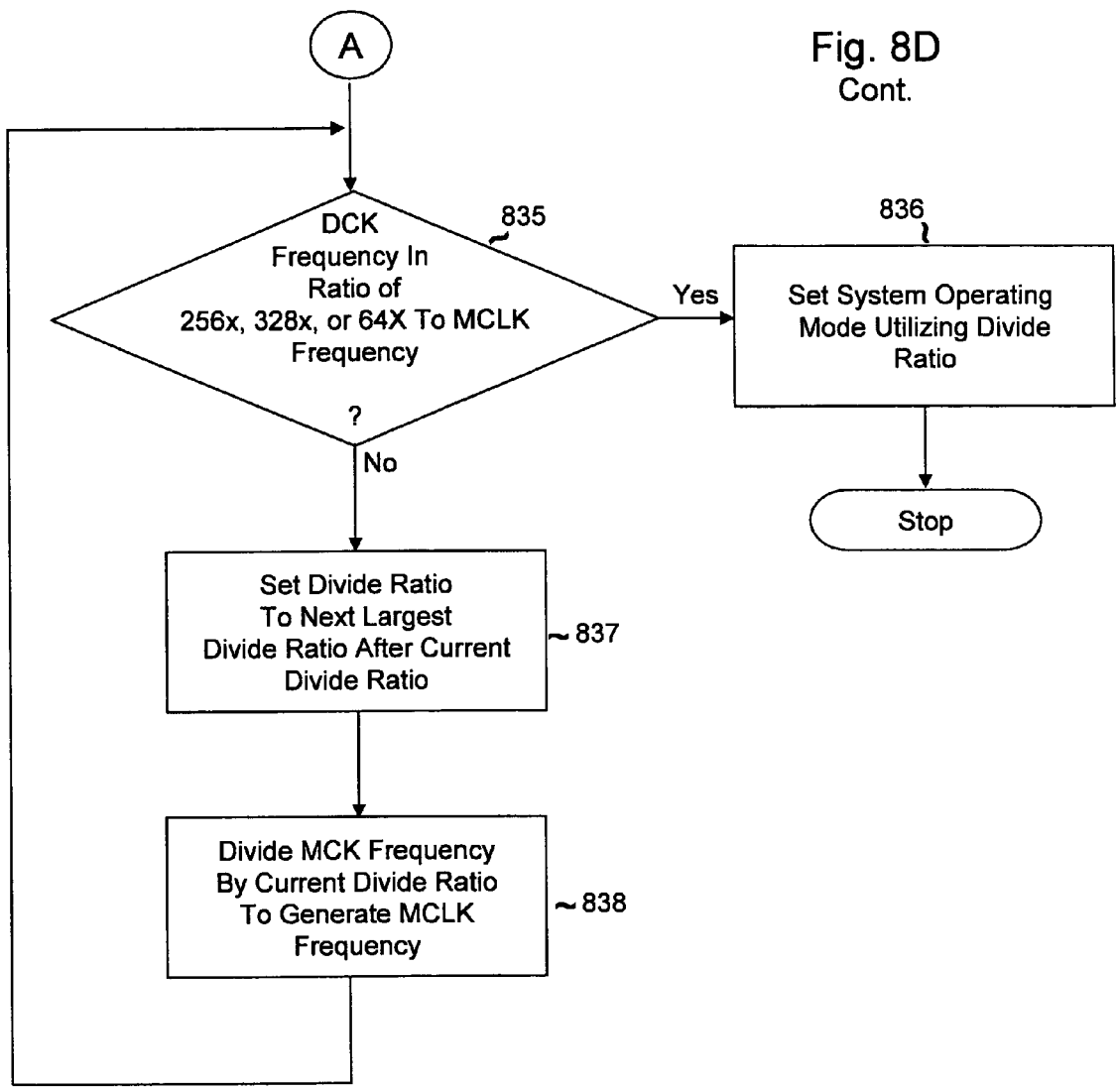

FIG. 8D is a flow chart of another exemplary mode mapping procedure 850 that may be applied to the embodiments of MCK frequency measurement block 301 and DCK frequency to MCK frequency ratio measurement block 302 illustrated in FIGS. 8A and 8B. In particular, mode mapping procedure 850 cycles from the first element in the candidate ratio list (i.e. the smallest candidate ratio).

Clock mode mapping starts at block 830. At block 831, a list is generated of potential clock divide ratios sorted in ascending order. The current divide ratio at block 832 is the next largest ratio on the list, which is the first (smallest) ratio on the list for the first iteration of procedure 830. The current divide ratio is then utilized at block 833 to divide the MCK frequency to generate a candidate MCLK frequency.

At block 834, a check is made to determine whether the candidate MCLK frequency is too fast. If the MCLK frequency is too fast, then procedure 830 returns to block 832 and the next largest ratio on the list becomes the current ratio, and the operations at blocks 833 and 834 are repeated. Otherwise, procedure 830 moves to block 835.

At block 835, a determination is made as to whether the DCK frequency is in a ratio of 256×, 128× or 64× to the MCLK frequency. If the DCK frequency is in a ratio of 256×, 128× or 64× to the candidate MCLK frequency, then the candidate MCLK frequency is utilized in the system operating mode at block 836. Otherwise, at block 837, the divide ratio is set to the next largest divide ratio after the current divide ratio. A new candidate MCLK frequency is generated at block 838 and then procedure 830 returns to block 835 and a new test is made of the DCK to MCLK frequency ratio.

Procedures 800 and 850 described above advantageously achieve the goal of selecting a divide ratio that provides a MCK frequency that is not too fast, and has the largest possible DCK frequency to MCLK frequency ratio from the set {256×, 128×, 64×}. If at any time either list of candidate divide ratios has insufficient entries to support the current DCK frequency to MCK frequency ratio, then the chip is not yet receiving MCK and DCK clock signals in the proper ratio, and therefore the selected process starts over.

The user may change the sample rate (i.e. the DCK frequency) and/or external MCK frequency during the mode detection process. If this event occurs, after mode detection is complete, the selected procedure alternates between checking the current MCK frequency and a MCK frequency twice as fast, with the absolute frequency detection rate checker 805 of FIG. 8B. If the current MCK frequency becomes too fast, or both the sample rate divided by two (2) is not too fast and the system is not in single speed mode, then the user has made a change and the process must start again to detect the new MCK frequency. Alternately, if the user is simply required to provide an unsupported DCK frequency to MCK frequency ratio for a time when changing rates, the current DCK frequency to MCK frequency ratio is continually checked, which advantageously eliminates the need for duplicate divider hardware.

In order to add hysteresis to the circuitry illustrated in FIGS. 8A and 8B, once a mode had been detected, a hysteresis frequency detection circuit 806, having a trip point at a strictly higher or lower MCLK frequency than the trip point of absolute frequency detection circuit 805, monitors the MCK frequency. In particular, the trip point of hysteresis frequency detection circuit 806 is selected to account for variations in the MCK frequency due to variations in operating conditions (e.g., supply voltage and temperature). Furthermore, the operating envelope of hysteresis frequency detection circuit 806 does not overlap the operating envelope of the absolute frequency detector 805. Alternately, the detector trip point of absolute frequency detection circuit 805 may be adjusted after the mode is selected to achieve the same effect. For example, in embodiments of absolute frequency detector 805 utilizing a current source generating a ramp signal, the trip point can be moved by trimming the current source (i.e., turning off a current source in parallel).

After mode selection, hysteresis frequency detection circuitry 806 determines if the MCK frequency is too fast or too slow. This determination allows the chip to operate on a divide ratio whose generated MCK frequency is near the trip point of absolute frequency detection circuitry 805. If the MCK frequency falls above or below the trip points set by hysteresis frequency detection circuitry 806, then mode detection lock has been lost, and the given mode selection process discussed above is repeated, utilizing absolute frequency detection circuitry 805. In other words, once a valid mode is selected, the chip operates in that mode until the DCK and/or MCK signals applied to the chip are altered and consequently the MCK frequency is outside the operating envelope of hysteresis frequency detection circuit 806.

Advantageously, the addition of hysteresis into the mode selection process ensures that all sample rates (DCK frequencies) over a wide range are usable, rather than only a discrete set of sample rates. Furthermore, hysteresis allows an even larger set of DCK frequency to MCK frequency ratios to be supported, including many not currently foreseen as necessary. Finally, the introduction of hysteresis also allows for mode detection to be implemented, with sample rates varying on the fly.

In some embodiments of mode detection and clock signal generation circuits 300, 310, 320, 330, and 340 shown in FIGS. 3A-3E, MCK frequency measurement block 301 receives information regarding the current and/or past chip modes for adjustment of the MCK frequency measurement. For example, in certain chip operating modes, the chip or system may be safely run at a higher maximum MCK frequency, such that the trip point at which the measurement reports the frequency as too high may be moved upward when the chip is in, or has recently been in, an operating mode which allows faster operation, and moved downward when this chip is in, or has recently been in, an operating mode which requires a slower internal master clock.

Mode mapping blocks 303 of exemplary clock mode detection and clock signal generation circuits 300, 310, 320, 330, and 340 shown in FIGS. 3A-3E support a number of different mapping functions according to the principles of the present invention. A number of representative mapping functions embodying these principles are as follows.

According to one particular embodiment of these principles, mode mapping blocks 303 apply an explicit formula to the data provided by MCK frequency measurement block 301 and/or DCK frequency to MCK frequency ratio measurement block 302.

In the illustrated embodiment, the explicit formula is derived as follows:

Let the variable x be MCK frequency measurement in MHz;
Let the variable y be the DCK:MCK frequency ratio measurement (preferably y is a whole number);
Let the variable fx be the maximum permitted MCK frequency in MHz;
Let the mode be represented as a pair {Divide, Filter} where the value Divide is the divisor for dividing the MCK frequency to generate a corresponding MCLK frequency and where the value Filter indicates the choice of filter preferred for the DCK:MCK frequency ratio at divide by /;

$$\text{Want Divide} \geq \frac{x}{fx} \quad \text{Filter} = \frac{y}{\text{Divide}};$$

For an arbitrarily large # of filters:

$$\text{Divide} = \frac{x}{fx} \quad \text{Filter} = \frac{y * fx}{x}$$

To bound Divide to increments of 0.5>=1, then $$\text{Divide} = \max\left(1, \frac{CEIL\left(\frac{x}{fx} \cdot 2\right)}{2}\right);$$

$$\text{Filter} = \frac{y}{\text{Divide}};$$

(i.e. to obtain Divide greater to or equal to one, which is a multiple of 0.5)

But it is preferred to require a small number of filters;
For example, assume filters of: 256× (single speed)
  128× ("double speed")
  64× ("quad speed")
Then a formula for mode may use rounding, truncation, and/or ceiling functions;
If fx is ignored, and assume support for an arbitrary number of divide ratios, then;
Filter=64, $$\text{Divide} = \frac{y}{64}$$

(This may leave the chip running slow in some case);
Still ignoring fx, assuming values of Divide of 1, 1.5, 2, 2.5, 3, 3.5, . . . and assuming maximum MCLK frequency:
If y≧256, use 256× filter else if yz 128× use 128 filter else use 64× filter;
Equivalently as a formula Filter=2^MIN(MAX(FLOOR (log$_2$y), 6), 8), in which 2^ represents "2 to the power of"; and
Divide=y/Filter Now take fx into account:

$$\text{Filter} = 2 \wedge \text{MIN}\left(\text{MAX}\left(\text{FLOOR}\left(\log_2\left(\frac{y}{\text{MAX}/1, \frac{ceil\left(\frac{x}{fx} \cdot 2\right)}{2}}\right)\right), 6\right), 8\right);$$

$$\text{Divide} = \frac{y}{\text{Filter}}$$

Advantageously, the ceiling (CEIL) and floor (FLOOR) functions allow the above formula to be efficiently implemented in hardware (circuitry). For example, the floor of a logarithmic function is simpler to compute than a real number result. Generally, the explicit formula utilized in a given embodiment, such as the exemplary formula provided above, is selected to achieve a MCK frequency no greater than maximum permitted chip or system digital clock frequency and which is supported by the corresponding number of associated on-chip digital filters. Additionally, the selected formula must be appropriate to the MCK frequency and/or DCK frequency detection schemes utilized in the chip.

Exemplary mapping Embodiment 2, suitable for utilization in mode mapping block 303 of FIGS. 3A-3E, utilizes a lookup table to select the clock operating mode based on the measurements of the MCK absolute frequency and the ratio of the DCK frequency to the MCK frequency ratio. Preferably, the lookup table entries are generated from a selected mathematical relationship, similar to that discussed above.

As an example, consider a PCM audio system, in which the DCK signal is the standard LRCK signal and the PCM audio input data is provided in a supported chip clock mode. Additionally, assume the MCK frequency is measured by associated MCK frequency measurement block 301 in 6.2 MHz increments as X (MHz) and DCK frequency to MCK frequency ratio measurement block 302 measures the LRCK frequency to MCK frequency ratio as Y, which is represented as a whole number in 11-bit binary form. A two-variable mode vector (Divide, Filter) is selected, in which Divide is the value to divide the MCK frequency to generate the MCK frequency, and Filter is the number of the filter to select. For example, Filter=1 may select a filter suitable for a 256× LRCK frequency to MCK frequency ratio, Filter=2 a filter suitable for a 128× LRCK frequency to MCK frequency ratio, and Filter=4 a filter suitable for a 64× LRCK frequency to MCK frequency ratio.

A lookup table is generated and stored in memory that contains table entries for desired modes for various MCK frequencies and various MCK to LRCK frequency ratios. The mode entries in the lookup table are addressed, for the example of a 256 entry table, by three MCK frequency measurement bits generated by MCK frequency measurement circuitry 301 and five shifted-right LRCK frequency to MCK frequency ratio measurement bits generated by DCK frequency to MCK frequency ratio measurement circuitry 302, for a total of nine address bits An additional entry is provided for Invalid Mode, which lists a divide value of 0, and leaves the chip or system in its current mode.

Representative mapping procedures 900, 910, 920, and 930 are respectively illustrated in the flow charts of FIGS. 9A-9D. Generally, procedures 900, 910, 920, and 930 allow a mapping function to give preference to certain modes, or avoid certain modes, based on a preference ordering imposed on the listing of modes. Procedures 900, 910, 920, and 930 cycle through lists of modes in order, checking each mode in turn for its acceptability, and breaking out of the loop and staying with the current mode when the current mode is found to be acceptable. In the illustrated embodiments, when the next mode detection is done, each procedure starts again with the first mode in the list and proceeds in order, rather than beginning with the last selected mode.

In procedure 900, natural number divide ratios are preferred, such that all modes which involve natural number divide ratios are listed and selected before all modes which involve non-natural number divide ratios.

Clock mode mapping starts at block 900A (change current 900 to 900A). At block 901, all supported modes are listed, with all natural number divide ratios first (e.g. /1 single speed, /1 double speed, /2 quad speed, . . . , /1.5 double speed). The next mode on the list is taken at block 902, and tested at block 903. Specifically, if the divide ratio for current mode is high enough such that MCLK frequency will not be too fast and the data filter configuration that the mode implements is appropriate for a $$\left(\frac{MCK}{\text{divider}} : LRCK\right)$$

ratio, then the current mode is utilized by the system at block 904. Otherwise, procedure 900 returns to block 902 and the next mode on the list is tested.

Figure 9A:
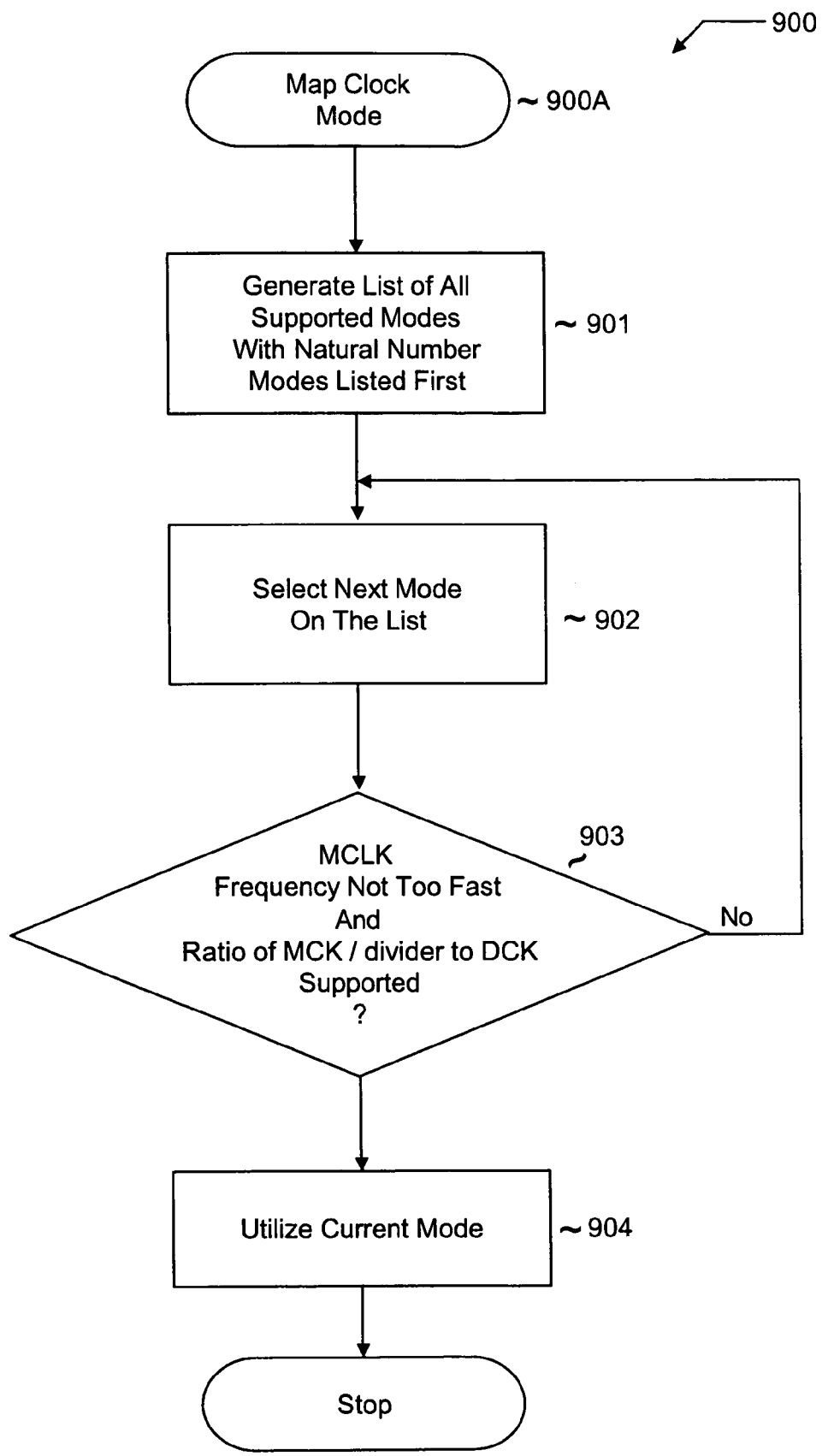
FIGS. 9A-9D are respective flow charts of representative mode mapping procedures suitable for utilization in the mapping system shown in FIGS. 3A-3E.
Figure 9B:
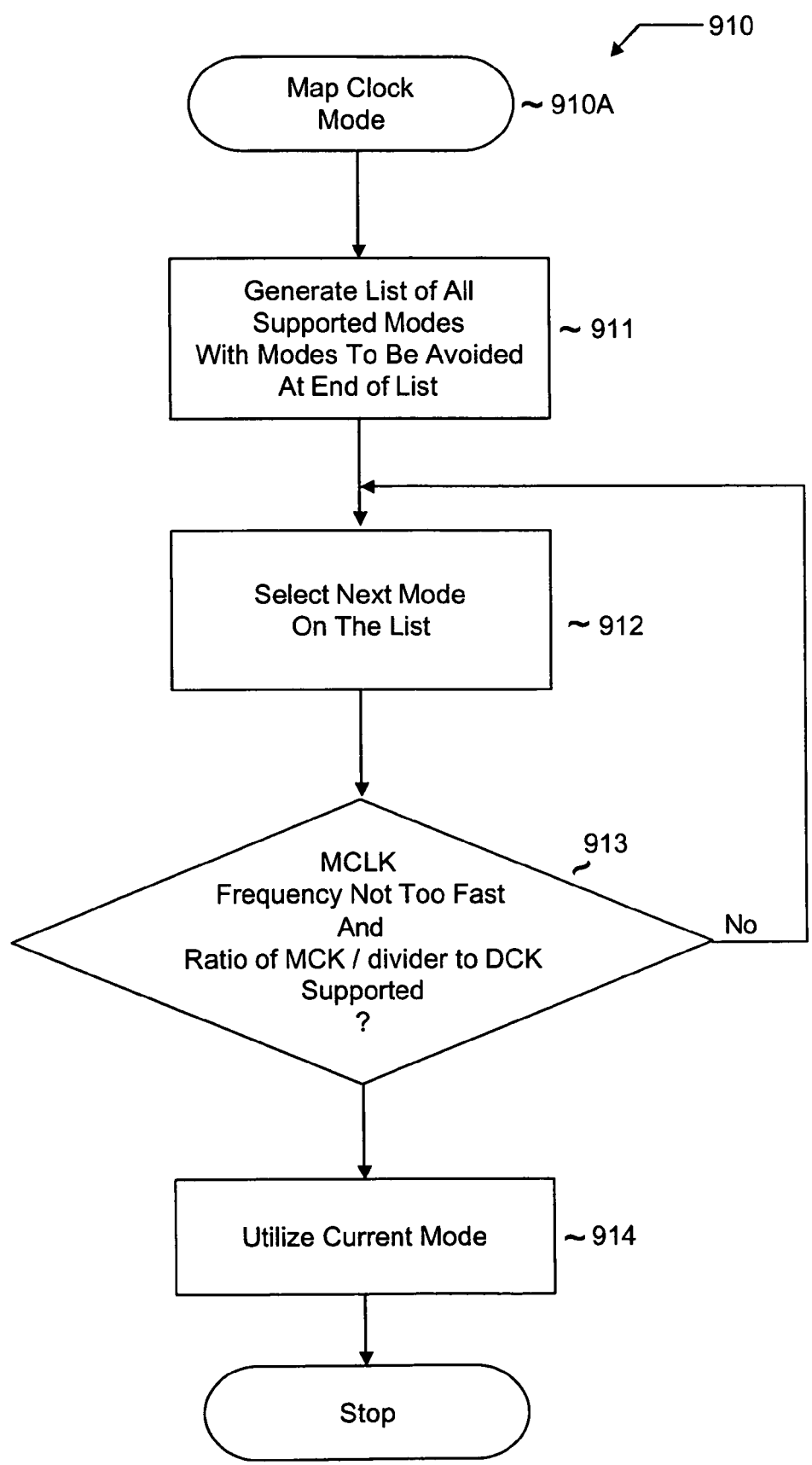

In procedure 910 of FIG. 9B, certain modes, which are supported by the given data converter, but should be avoided when other modes are preferred, are placed at the end of the list of modes.

Clock mode mapping starts at block 910A. At block 911, all supported mode are listed, with all modes to be avoided placed at the end of the list (e.g. the /3 quad or /3 double speed modes). The next mode on the list is taken at block 912, and tested at block 913. Specifically, if the divide ratio for current mode is high enough such that MCLK frequency will not be too fast and the data filter configuration which the mode implements is appropriate for a $$\left(\frac{MCK}{\text{divider}} : LRCK\right)$$

ratio, then the current mode is utilized by the system at block 914. Otherwise, procedure 910 returns to block 912 and the next mode is tested.

Figure 9C:
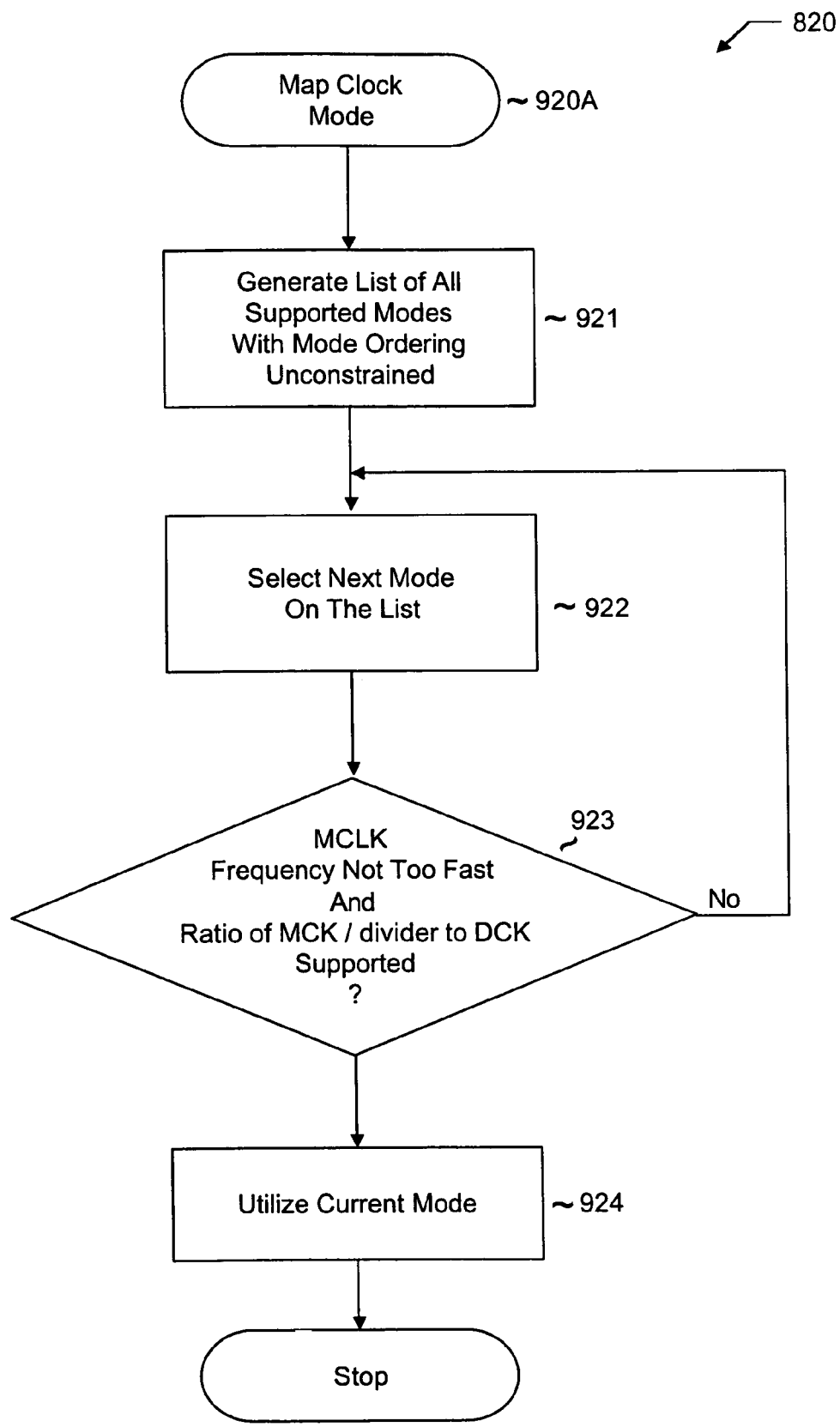
Figure 9D:
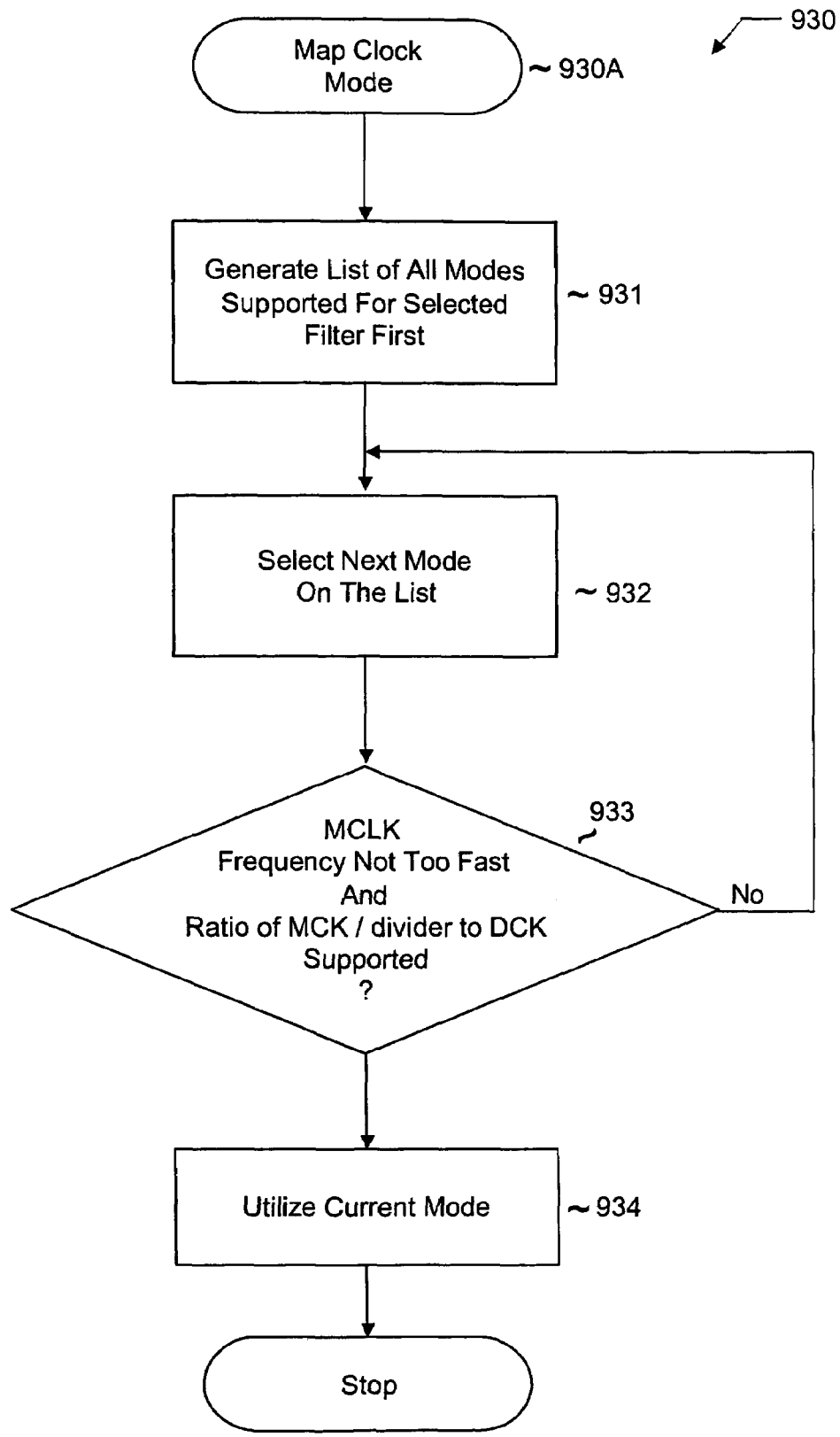

In procedure 920 of FIG. 9C, the mode ordering is not constrained, and the effect is to simply try each mode until an acceptable mode is found. At block 921, all supported modes are listed, without any constraint on mode ordering. The next mode on the list is taken at block 922, and tested at block 923. Specifically, if the divide ratio for current mode is high enough such that MCLK frequency will not be too fast and the data filter configuration which the mode implements is appropriate for a $$\left(\frac{MCK}{\text{divider}} : LRCK\right)$$

ratio, then the current mode is utilized by the system at block 924. Otherwise, procedure 920 returns to block 922 and the next mode is tested. In exemplary procedure 930 of FIG. 9D, those modes utilizing the preferred filter (i.e. an interpolation filter in a DAC, a decimation filter in an ADC, or an SRC filter) are listed before all other modes in the mode listing. Clock mode mapping starts at block 930A At block 931, all supported mode settings for a selected filter are listed first, followed by all other modes supported by the system (e.g. list of all other modes supported by single speed filter, followed by a list of all other modes). The next mode on the list is taken at block 932, and tested at block 933. Specifically, if the divide ratio for current mode is high enough such that MCLK frequency will not be too fast and the data filter configuration which the mode implements is appropriate for a $$\left(\frac{MCK}{\text{divider}} : LRCK\right)$$

ratio, then the current mode is utilized by the system at block 934. Otherwise, procedure 930 returns to block 932 and the next mode is tested.

Exemplary procedure 1000 of FIG. 10 is a mapping procedure that adjusts for former mode selections. (Have arrow point from 1000 to entire flow chart.) In particular, a list of modes is circularly linked such that when the mode at the end of the list is reached, the procedure returns to the mode at the beginning of the list.

Specifically, at block 1001, a circularly linked list of all supported modes is generated. At 1002, a candidate mode pointer to a candidate entry of the circularly linked list is set. At power on reset, the candidate mode pointer is set to a selected default mode; otherwise, the candidate mode pointer is the pointer from the last mode determination made utilizing procedure 1000.

At block 1003, if the divide ratio for current mode selected by the candidate pointer is high enough such that MCLK frequency will not be too fast or too slow and the data filter configuration which the mode implements is appropriate for the corresponding $$\left(\frac{MCK}{\text{divider}} : LRCK\right)$$

ratio, then the current mode is utilized by the system at block 1004; otherwise, the candidate pointer increments at block 1005, and procedure 1000 returns to block 1002 to test the next candidate mode.

In other words, procedure 1000 proceeds through the list of modes, testing each mode until an appropriate mode is detected, at which point that mode is selected as the chip operating mode. If procedure 1000 is reentered, the search starts on the list of modes with the current chip mode rather than at the original beginning of the list. Consequently, if there are multiple valid modes for a given chip configuration, the current mode selection may be different depending on the last mode selection.

Alternate methods that select a new mode based on past mode selections include storing a bias value to apply to a measurement result (e.g., the MCK frequency measurement, or the DCK frequency to MCK frequency ratio measurement)

based on the last mode selection, and creating a new list ordering when setting a mode.

Figure 11:
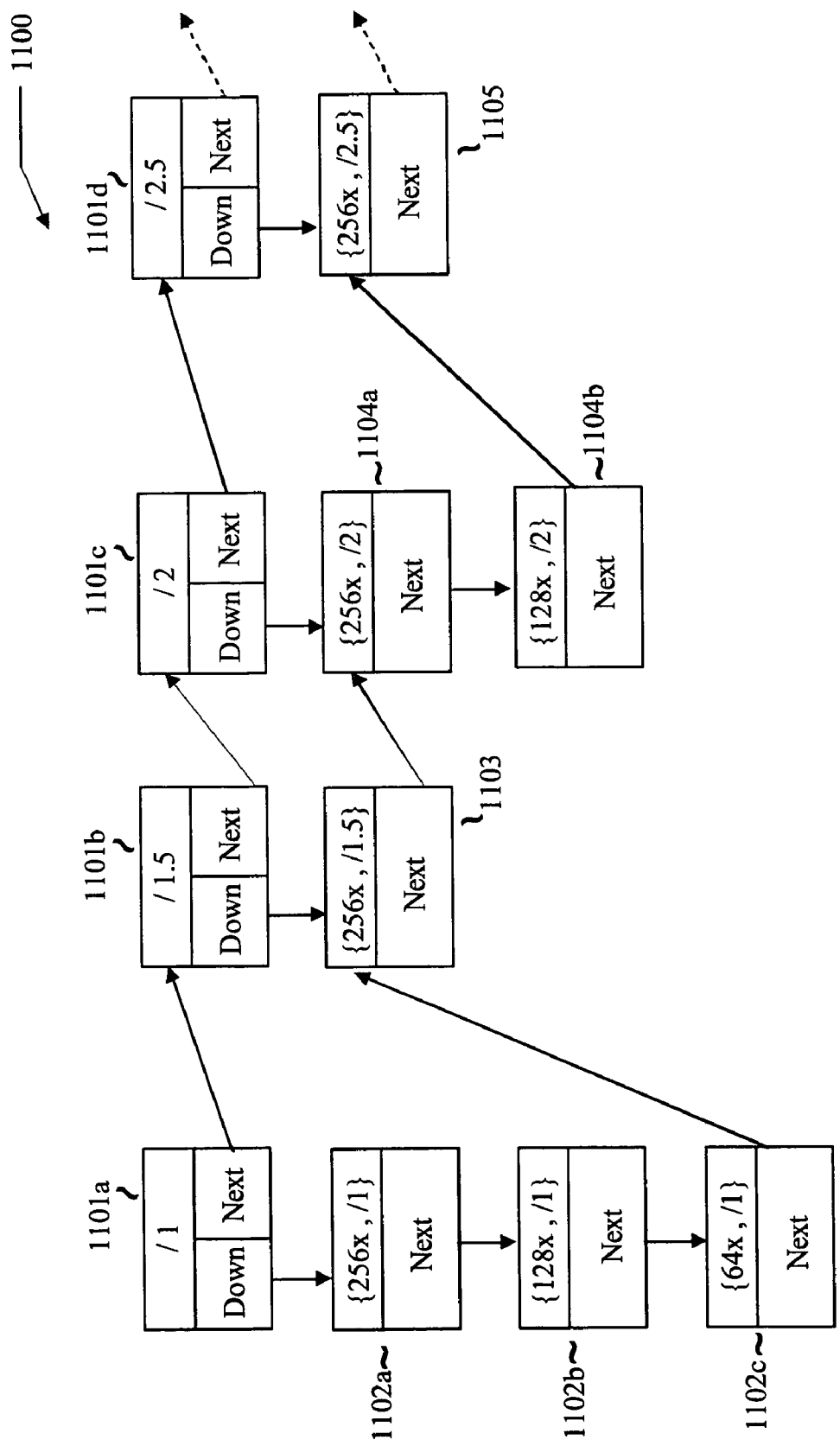
FIG. 11 is a conceptual diagram illustrating graphically a mode mapping method utilizing linked lists according to the inventive principles.

In mapping procedure 1100 shown graphically in FIG. 11, mode mapping is performed by first narrowing the choice of divide ratios based on the absolute frequency measurement of the MCK frequency performed by MCK frequency measurement circuitry 301 of FIGS. 3A-3E. The mode is then selected based on the supported ratio of the DCK frequency to the MCLK frequency.

Specifically, a list of entries corresponding to a set of divide ratios is created, with the entries ordered from the smallest corresponding divide ratio to the largest corresponding divide ratio. Four exemplary divide ratio entries 1101a-1101d, corresponding to divide ratios /1, /1.5, /2, and /2.5 are shown in FIG. 11 for reference.

Each divide ratio entry 1101a-1101d includes a pointer NEXT pointing to the next largest divide ratio in the list. Each divide ratio entry on the list also includes a pointer DOWN, which points to a sub-list of the supported modes at that divide ratio, for example, sub-lists 1102a-1102c associated with /1 divide ratio entry 1101a, sub-list 1103 associated with /1.5 divide ratio entry 1101b, sub-lists 1104a-1104b associated with /2 divide ratio entry 1101c, and sub-list 1105 associated with /2.5 divide ratio entry 1101d.

Sub-lists associated with a given divide ratio also include a pointer NEXT, pointing to the next mode on that sub-list. For example, for /1 divide ratio 1101a, 256× sub-list 1102a points to 128× sub-list 1102b, which in turn points to 64× sub-list 1102c. The end of the last sub-list of each divide ratio entry points to the first sub-list of supported modes for the next divide ratio. For example, the NEXT pointer of 64× sub-list 1102c associated with /1 divide ratio entry 1101a points to sub-list 1103 associated with /1.5 divide ratio entry 1101b.

The mapping procedure proceeds through the list of divide ratios, by measuring the absolute frequency of an MCLK signal created by dividing the MCK frequency by the current divide ratio on the list. Alternatively, the measured MCK frequency is divided by the current divide ratio on the list. Once a divide ratio is reached on the list which does not create an MCLK frequency which is not too fast, the sub-list of modes pointed-to by that divide ratio is examined. The first entry of this sub-list which is allowed by the result of the measurement of the ratio of the DCK frequency to the MCLK frequency is chosen as the chip mode.

For example, in a chip with a maximum supported MCLK frequency of 12.5 MHz, if a 25 MHz MCK signal is applied, the search will move through the /1 and /1.5 divide ratio entries 1101a and 1101b on the list and then begin checking modes on the sub-lists 1104a and 1104b associated with the /2 divide ratio entry 1101c. Then, for example, if the DCK frequency to MCK frequency ratio is 512, since sub-list 1104a requires a 256× ratio of the DCK frequency to the MCLK frequency and a divide ratio of two, and it is the first valid mode for the /2 divide ratio, then the mode corresponding to sub-list 1104a becomes the operating mode.

Although the invention has been described with reference to specific embodiments, these descriptions are not meant to be construed in a limiting sense. Various modifications of the disclosed embodiments, as well as alternative embodiments of the invention, will become apparent to persons skilled in the art upon reference to the description of the invention. It should be appreciated by those skilled in the art that the conception and the specific embodiment disclosed might be readily utilized as a basis for modifying or designing other structures for carrying out the same purposes of the present invention. It should also be realized by those skilled in the art that such equivalent constructions do not depart from the spirit and scope of the invention as set forth in the appended claims.

It is therefore contemplated that the claims will cover any such modifications or embodiments that fall within the true scope of the invention.

What is claimed is:

1. A system for determining a data converter operating mode comprising:
    measurement circuitry operable to:
        measure a master clock frequency of a master clock signal received without a modification in frequency from a master clock signal source; and
        measure a frequency ratio between a frequency of a data clock signal and the master clock frequency; and
    a mapping system for mapping the measurements of the master clock frequency and the frequency ratio to an operating mode of the data converter.

2. The system of claim 1, wherein the measurement circuitry is operable to measure the master clock frequency by comparing the master clock frequency against a reference signal having a fixed frequency.

3. The system of claim 2, wherein the measurement circuitry is fabricated on a single chip together with the data converter and the reference signal having a fixed frequency is received from an off-chip reference clock source.

4. The system of claim 2, wherein the reference signal having a fixed frequency is provided by an oscillator.

5. The system of claim 2, wherein the measurement circuitry comprises:
    counter circuitry for counting periods of the master clock signal and the reference signal; and
    comparator circuitry for comparing a count value of counted periods of the master clock signal and a count value of counter periods of the reference clock signal and generating in response to the comparison a control signal for utilization by the mapping system.

6. The system of claim 5, wherein the data converter is selected from the group consisting of analog to digital converters, digital to analog converters, and sample rate converters.

7. The system of claim 1, wherein at least one of the measurement circuitry and the mapping system is formed together on a single chip with the data converter.

8. A method for determining a data converter operating mode comprising:
    measuring a master clock frequency of a master clock signal received without a modification in frequency from a master clock signal source;
    measuring a frequency ratio between a frequency of a data clock signal and the master clock frequency; and
    mapping the measurements of the master clock frequency and the frequency ratio to an operating mode of the data converter.

9. The method of claim 8, wherein measuring the master clock frequency comprises comparing the master clock frequency against a reference signal having a fixed frequency.

10. The method of claim 9, wherein the measurement circuitry is fabricated on a single chip together with the data converter and further comprising receiving the reference signal with a fixed frequency from an off-chip reference clock source.

11. The method of claim 9, further comprising generating the reference signal having a fixed frequency with an oscillator.

12. The method of claim 10, wherein measuring the master clock frequency comprises:
- counting periods of the master clock signal and the reference signal;
- comparing a count value of counted periods of the master clock signal and a count value of counted periods of the reference clock signal; and
- generating in response to the comparison a control signal for utilization by the mapping system.

13. The method of claim 9, further comprising selecting the data converter from the group consisting of analog to digital converters, digital to analog converters, and sample rate converters.

14. A system for determining a data converter operating mode comprising:
- measurement circuitry operable to:
  - measure a master clock frequency of a master clock signal; and
  - measure a frequency ratio between a frequency of a data clock signal and the master clock frequency, wherein the measurement circuitry measures the master clock frequency independent of information obtained during the measurement of the frequency ratio; and
- a mapping system for mapping the measurements of the master clock frequency and the frequency ratio to an operating mode of the data converter.

15. The system of claim 14, wherein the measurement circuitry measures the master clock frequency prior to measuring the frequency ratio.

16. The system of claim 14, wherein the measurement circuitry measures the master clock frequency substantially simultaneously with measuring the frequency ratio.

17. A method for determining a data converter operating mode comprising:
- measuring a frequency ratio between a frequency of a data clock signal and a master clock frequency of a master clock signal;
- measuring the master clock frequency of the master clock signal independent of information obtained during measurement of the frequency ratio; and
- mapping the measurements of the master clock frequency and the frequency ratio to an operating mode of the data converter.

18. The method of claim 17, wherein measuring the master clock frequency is performed prior to measuring the frequency ratio.

19. The method of claim 17, wherein measuring the master clock frequency is performed substantially simultaneously with measuring the frequency ratio.

20. A system for determining a data converter operating mode comprising:
- measurement circuitry operable to:
  - measure a master clock frequency of a master clock signal; and
  - measure a frequency ratio between a frequency of a data clock signal and the master clock frequency; and
- a mapping system for mapping the measurements of the master clock frequency and the frequency ratio to an operating mode of the data converter, the mapping system giving priority to a mode which utilizes a preferred filter from among a plurality of acceptable filters of the data converter.

21. The system of claim 20, wherein mapping system is operable to proceed sequentially through a list of modes prioritized by filter preference checking each mode reached for acceptability until an acceptable mode is found.

22. The system of claim 21, wherein the mapping system is further operable during a beginning of each mapping operation to return to from a first mode in the list of modes.

23. A method for determining a data converter operating mode comprising:
- measuring a master clock frequency of a master clock signal; and
- measuring a frequency ratio between a frequency of a data clock signal and the master clock frequency; and
- mapping the measurements of the master clock frequency and the frequency ratio to an operating mode of the data converter and giving priority to a mode which utilizes a preferred filter from among a plurality of acceptable filters of the data converter.

24. The method of claim 23, wherein mapping the measurements comprises sequentially proceeding through a list of modes prioritized by filter preference checking each mode reached for acceptability until an acceptable mode is found.

25. The method of claim 20, wherein mapping the measurements further comprises returning at a beginning each mapping operation to a first mode in the list of modes.

26. A system for determining a data converter operating mode comprising:
- measurement circuitry operable to:
  - measure a master clock frequency of a master clock signal; and
  - measure a frequency ratio between a frequency of a data clock signal and the master clock frequency; and
- a mapping system for mapping the measurements of the master clock frequency and the frequency ratio to an operating mode of the data converter, the mapping system giving lower priority to modes associated with selected master clock frequency divide ratios of a plurality of acceptable master clock frequency divide ratios utilized to divide the master clock frequency.

27. The system of claim 26, wherein mapping system is operable to proceed sequentially through a list of modes prioritized by master clock frequency divide ratios checking each mode reached for acceptability until an acceptable mode is found.

28. The system of claim 27, wherein the mapping system is further operable during a beginning of each mapping operation to return to a first mode in the list of modes.

29. A method for determining a data converter operating mode comprising:
- measuring a master clock frequency of a master clock signal; and
- measuring a frequency ratio between a frequency of a data clock signal and the master clock frequency; and
- mapping the measurements of the master clock frequency and the frequency ratio to an operating mode of the data converter giving lower priority to modes associated with selected master clock frequency divide ratios of a plurality of acceptable master clock frequency divide ratios utilized to divide the master clock frequency.

30. The method of claim 29, wherein mapping the measurements comprises sequentially proceeding through a list of modes prioritized by master clock frequency divide ratios checking each mode for acceptability until an acceptable mode is reached.

31. The method of claim 30, wherein mapping the measurements comprises at a beginning of each mapping operation returning to a first mode in the list of modes.

32. A system for determining a data converter operating mode comprising:
measurement circuitry operable to:
measure a master clock frequency of a master clock signal; and
measure a frequency ratio between a data clock frequency of a data clock signal and the master clock frequency; and
a mapping system for mapping the measurements of the master clock frequency and the frequency ratio to an operating mode of the data converter, the mapping system narrowing a set of master clock frequency divide ratios to a subset of master clock frequency divide ratios and subsequently mapping to an operating mode from the subset of master clock frequency divide ratios based on the frequency ratio between the data clock frequency and the master clock frequency.

33. The system of claim 32, wherein the mapping system is operable to:
access a list of master clock frequency divide ratios, each master clock frequency divide ratio pointing to a sub-list of corresponding modes;
proceed through the list of master clock frequency divide ratios until an acceptable master clock divide ratio is reached; and
proceed through the sub-list of modes corresponding to the acceptable master clock divide ratio until an acceptable mode is reached.

34. A method for determining a data converter operating mode comprising:
measuring a master clock frequency of a master clock signal;
measuring a frequency ratio between a data clock frequency of a data clock signal and the master clock frequency; and
mapping the measurements of the master clock frequency and the frequency ratio to an operating mode of the data converter comprising:
narrowing a set of master clock frequency divide ratios to a subset of master clock frequency divide ratios; and
mapping to an operating mode from the subset of master clock frequency divide ratios based on the frequency ratio between the data clock frequency and the master clock frequency.

35. The method of claim 34, wherein mapping the measurements comprises:
accessing a list of master clock frequency divide ratios, each master clock frequency divide ratio pointing to a sub-list of corresponding modes;
proceeding through the list of master clock frequency divide ratios until an acceptable master clock divide ratio is reached; and
proceeding through the sub-list of modes corresponding to the acceptable master clock divide ratio until an acceptable mode is reached.

* * * * *